(12) United States Patent
Kanemoto et al.

(10) Patent No.: US 8,609,445 B2
(45) Date of Patent: Dec. 17, 2013

(54) OPTICAL TRANSMISSION MODULE AND MANUFACTURING METHOD OF THE SAME

(75) Inventors: Mitsunori Kanemoto, Tokyo (JP); Tarou Kaneko, Tokyo (JP)

(73) Assignee: NEC Corporation, Tokyo (JP)

( * ) Notice: Subject to any disclaimer, the term of this patent is extended or adjusted under 35 U.S.C. 154(b) by 395 days.

(21) Appl. No.: 13/112,584

(22) Filed: May 20, 2011

(65) Prior Publication Data

US 2011/0217798 A1 Sep. 8, 2011

Related U.S. Application Data

(62) Division of application No. 12/063,555, filed as application No. PCT/JP2006/316329 on Aug. 21, 2006, now Pat. No. 7,977,127.

(30) Foreign Application Priority Data

Sep. 13, 2005 (JP) .................................. 2005-264723

(51) Int. Cl.
*H01L 21/58* (2006.01)
*H01S 5/022* (2006.01)

(52) U.S. Cl.
USPC .................................. 438/26; 359/344; 438/27

(58) Field of Classification Search
USPC .......... 359/344; 438/26, 27; 372/50.22, 50.23
See application file for complete search history.

(56) References Cited

U.S. PATENT DOCUMENTS

| | | | |
|---|---|---|---|
| 4,469,929 A * | 9/1984 | Rosen et al. ............. | 219/121.64 |
| 5,065,226 A | 11/1991 | Kluitmans et al. | |
| 5,436,920 A | 7/1995 | Minemoto et al. | |
| 6,381,066 B1 | 4/2002 | Korn | |
| 6,594,092 B2 | 7/2003 | von Freyhold et al. | |
| 6,782,028 B2 | 8/2004 | Tsukiji et al. | |
| 2002/0012370 A1 | 1/2002 | Ishimaru | |
| 2002/0167017 A1 | 11/2002 | Nakabayashi et al. | |
| 2003/0053499 A1 | 3/2003 | Shinkai et al. | |
| 2004/0264538 A1 | 12/2004 | Namiwaka et al. | |
| 2004/0264891 A1 | 12/2004 | Namiwaka et al. | |

FOREIGN PATENT DOCUMENTS

| | | |
|---|---|---|
| EP | 1491928 | 12/2004 |
| EP | 1492208 | 12/2004 |
| JP | 7-099360 A | 4/1995 |
| JP | 09-186363 A | 7/1997 |
| JP | 2002-202471 A | 7/2002 |
| JP | 2003-101133 A | 4/2003 |
| JP | 2003-163404 A | 6/2003 |
| JP | 2003-258354 A | 9/2003 |
| JP | 2003-258385 A | 9/2003 |
| JP | 2005-017839 A | 1/2005 |
| JP | 2005-019820 A | 1/2005 |

* cited by examiner

*Primary Examiner* — Eric Bolda
(74) *Attorney, Agent, or Firm* — Sughrue Mion, PLLC

(57) ABSTRACT

[Problems] To accommodate a plurality of optical semiconductor elements in one package with their optical axes aligned highly precisely. [Means for Solving the Problems] An optical transmission module includes an optical transmission unit, a carrier to become a base, a semiconductor optical amplification element mounted on the carrier through a first sub-carrier, first and second lenses fixed on the carrier through first and second lens holders, an element supporting member and an optical isolator fixed on the carrier, a third lens holder supported by the element supporting member, a third lens and a small carrier individually fixed in the third lens holder, and a semiconductor laser element mounted on the small carrier through a second sub-carrier.

5 Claims, 22 Drawing Sheets

ALIGNMENT

ELEMENT SUPPORT
MEMBER WELDING

REALIGNMENT

THIRD LENS
HOLDER WELDING

RELATED ART

OPTICAL TRANSMISSION MODULE AND MANUFACTURING METHOD OF THE SAME

CROSS REFERENCE TO RELATED APPLICATIONS

This application is a Divisional of U.S. patent application Ser. No. 12/063,555 filed Feb. 11, 2008, which is a National stage of International Application No. PCT/JP2006/316329, filed Aug. 21, 2006, claiming priority based on Japanese Patent Application No. 2005-264723 filed Sep. 13, 2005, the contents of all of which are incorporated herein by reference in their entirety.

TECHNICAL FIELD

The present invention relates to an optical transmission module used for an optical communication system and a manufacturing method thereof, in particular, to an optical transmission module including a plurality of optical devices such as a semiconductor laser, a semiconductor optical amplifier, and the like in a same package and a manufacturing method thereof.

BACKGROUND ART

Along with increase in demand for optical communication in recent years, an optical communication system in smaller size with lower cost is strongly required to be provided. To construct an optical communication system with high reliability and low cost, it is important that the system can transmit data for a long distance without relay. As a way to perform it, an optical fiber amplifier and an optical semiconductor amplifier have been known. In the former case, an Er doped optical fiber is excited by an LD module for excitation. However, it needs a very long Er doped optical fiber and a very large LD module for excitation, so that it is disadvantageous in that it becomes expensive, and a system tends to be large. On the other hand, the latter, i.e. the optical semiconductor amplifier, has the same structure as a semiconductor laser element, so that the latter is advantageous to a system to be downsized, in addition, the latter enables a system to be constructed in lower cost comparing to the former case.

FIG. 21 is a configuration diagram showing a related optical transmission module using an optical semiconductor amplifier. In the present specification, a direction of an optical axis is called as a Z direction, a direction vertical to a main surface of a carrier to be a base is called as a Y direction, and a direction orthogonal to the Y and the Z directions is called as an X direction.

As shown in FIG. 21, an optical transmission module 290 includes a laser module 280 incorporating an optical modulator and an optical amplifier module 260.

The laser module 280 is composed of a laser element 281, a lens 282, a lens holder in a U-shape (unillustrated, see FIG. 22), an optical isolator 283, an element carrier 284, a peltier device 285, a lens 286, a ferrule 287, an optical fiber 288, a package 289, and so on.

The laser element 281 incorporates an optical modulator, and outputs a modulated optical signal (on optical signal). The lens 282 is in a structure with a transmissive glass part set in an alloy frame, and it collects optical signals outputted from the laser element 281 in a side of the optical isolator 283. The optical isolator 283 prevents the light from returning to the laser element 281. On the device carrier 284, the laser element 281, the lens 282, and the optical isolator 283 are fixed in alignment with a same optical axis. The peltier device 285 maintains a constant temperature of the laser element 281 so that the optical fiber 288 outputs the modulated optical signal stably. The lens 286 collects the optical signal transmitted through the optical isolator 283 on the optical fiber 288. The ferrule 287 fixes the optical fiber 288 on the package 289 through the lens 286. The optical fiber 288 guides the optical signal outputted from the laser element 281 to outside the package 289.

The optical amplifier module 260 is composed of an optical fiber 261, a ferrule 262, a lens 263, a lens 264, a semiconductor optical amplifying element 265, a lens 266, a lens 267, a ferrule 268, an optical fiber 269, a carrier 270, a peltier device 271, a package 272, and so on. In other words, the optical amplifier module 260 is composed of the semiconductor optical amplifying element 265 which amplifies and outputs an incident light, the optical fibers 261 and 269 for input and output, and the lenses 263, 264, 266, 267 which couple the semiconductor optical amplifying element 265 with input/output optical fibers 261, 269 with high efficiency.

The optical fiber 261 includes a splicing part (a fusion splicing part) 273 formed an edge thereof for splicing itself and the optical fiber 288, and guides the optical signal outputted from the laser module 280 to the optical amplifier module 260. The ferrule 262 fixes the optical fiber 261 on the package 272 through the lens 263. The lens 264 collects the optical signal transmitted through the lens 263 on the semiconductor optical amplifying element 265. The semiconductor optical amplifying element 265 operates on the same principle as the semiconductor laser, and produces an optical amplification effect for light injected from outside by using a gain function in a semiconductor active region depending on current injection. The lens 266 collects the optical signal amplified by the semiconductor optical amplifying element 265 on the lens 267. To align optical axes of the lens 264 and the semiconductor optical amplifying element 265, as well as optical axes of the semiconductor optical amplifying element 265 and the lens 266, the lenses 264 and 266 are fixed on the carrier 270 through U-shaped lens holders (unillustrated, refer to FIG. 22). The ferrule 268 fixes the optical fiber 269 on the package 272 through the lens 267. The optical fiber 269 guides the optical signal amplified by the semiconductor optical amplifying element 265 to outside the package 272.

To achieve a long-distance transmission without relay, the optical signal outputted from the laser element 281 is not sufficient. Therefore, in the optical transmission module 290, the optical signal from the laser element 281 is amplified by current injection at the semiconductor optical amplifying element 265 so as to be high-power output light, and is outputted from the optical fiber 269. The laser module 280 and the optical amplifier module 260 are produced separately, and then the optical fiber 288 of the laser module 280 and an input side of the optical fiber 261 of the optical amplifier module 260 are connected by fusion splicing to be used.

In the optical transmission module shown in FIG. 21, the lenses 264, 266, 282 and the like are fixed on the carriers by laser welding (YAG laser welding) using the U-shaped lens holder so that the optical axes thereof are aligned to the optical axis of the semiconductor optical amplifying element 265 and the laser element 281, and that a focal point is placed on a prescribed position. FIG. 22 is an exploded perspective view describing a method for fixing the lens 282 using the lens holder. The lenses 264 and 266 are also welded and fixed in the same way, so that the fixing method only for the lens 282 will be presented hereinafter.

A lens holder 291 includes a plate-like base part 291a and a pair of holding plates 291b and 291c provided vertically to the platy base part 291a. An interval between the holding plates 291*b* and 291*c* is designed to be almost equivalent to a width of the lens 282. Accordingly, the lens 282 can be held in between the holding plates 291*b* and 291*c*. The lens 282 is adjusted and fixed as follows. The lens holder 291 in which the lens 282 is set is placed on the carrier 284 on which the laser element 281 is bonded by die bonding. Then, while causing the laser element 281 to emit light, the lens and the lens holder are moved in the three axes directions for adjusting the lens 282 in an optimal position.

After the adjustment, the lens holder 291 and the carrier 284 are welded by laser welding at plural points (at 4 points, for example), so that the lens holder 291 is fixed. Accordingly, the position of the lens 282 in the X direction is fixed. Next, the lens 282 is moved again, upward and downward (in the Y direction), and backward and forward (in the Z direction) with respect to the lens holder 291, for adjusting the lens 282 in an optical position in the Y direction and the Z direction, and then the lens 282 and the lens holder 291 are welded by laser welding at plural points (at 4 points, for example). As described, because the lens holder 291 and the lens 282 are combined together, the lens 282 can be adjusted and fixed optimally in a position to which the laser element 281 emits light with respect to the three axes of X, Y, Z.

However, this related optical transmission module (hereinafter, referred to as a separated optical transmission module) is composed of a laser module and an optical amplifier module in separate packages, so that each of the packages, the input/output optical fibers, and the splice part of the optical fibers require a certain area and volume to be housed respectively. Therefore, the module is limited in downsizing and it is disadvantageous in that the module becomes large in size.

So, housing the laser element and the semiconductor optical amplifying element in a same package is proposed (refer to in Patent Documents 1 and 2, for example). In an optical transmission module proposed by those Patent Documents (hereinafter, an integrated optical transmission module), a laser element and a semiconductor optical amplifying element are bonded on a carrier by die bonding, and a plurality of lenses is fixed on the carrier using U-shaped lens holders respectively. Alternatively, a laser element is bonded on a carrier by die bonding, and a small carrier on which a semiconductor optical amplifying element is bonded by die bonding is fixed on the carrier using a U-shaped holder, and also a plurality of lenses is fixed on the carrier using U-shaped lens holders respectively.

Patent Document 1: Japanese Patent Application Laid-open No. 2005-17839

Patent Document 2: Japanese Patent Application Laid-open No. 2005-19820

DISCLOSURE OF THE INVENTION

Problems to be Solved by the Invention

As described above, in the related optical transmission modules, both in the separated type and the integrated type, a U-shaped holder (such as a lens holder and an optical amplifier element holder) is used to adjust positions of a lens and a semiconductor optical amplifying element and so on, so that optical axes of each device are aligned.

Meanwhile, metal melts and coagulates during processes of laser beam irradiation and cooling in welding, which causes heat extension and contraction in the holder, and a thermal stress is generated therein, too. Along with those processes, the holder is placed out of a right position and a right angle. When the holder and the small carrier on which the lens and the semiconductor optical amplifying element are bonded by die bonding are welded, the same problem also occurs. The lens and the semiconductor optical amplifying element are fixed out of right positions and right angles, which ends up a misalignment state with respect to the optical axis.

In a case of the related separated type shown in FIG. 21, even if the lenses 264 and 266 in the optical amplifier module are misaligned and fixed with respect to the optical axis, the effect of the misalignment can be decreased or eliminated by adjusting the positions of the lenses 263 and 267 to be fixed. Further, in this related case, some misalignment is not to be serious defect if any, because there are wide margins for the alignment.

However, in the case of the integrated optical transmission module, emitting light from the laser element needs to be injected into an active layer of the semiconductor optical amplifying element, and that requires high accuracy for the alignment between the laser device and the semiconductor optical amplifying device. In addition, the effect of misalignment cannot be compensated or eliminated, which is unlike the case of the separated optical transmission module where the compensation or elimination is performed by the lenses fixed later. In other words, the separated optical transmission module can be saved as a non-defective product because optical coupling rate does not decrease so much even if lenses of the module are fixed in a misalignment state or an angular misalignment state to some extent. On the other hand, the integrated optical transmission module tends to be a defective product with a high possibility when it includes even a slight misalignment or a slight angular misalignment which causes extreme drop in the optical coupling rate. Therefore, the integrated optical transmission module requires extremely high accuracy for its assembling. Thus, an efficient workability is not achieved, and a high yield cannot be expected.

An object of the present invention is to solve the aforementioned problem with the related technique, and to provide an integrated optical transmission module produced with efficient workability and high accuracy.

Means of Solving the Problems

To achieve the aforementioned object, an optical transmission module according to the present invention includes: a first optical device disposed at an output side; a second optical device which is disposed with its optical axis being aligned with an optical axis of the first optical device; a carrier on which either the first or the second optical device is fixed; an element support member having a first surface parallel to the optical axes and a second surface vertical to the optical axes; a package for housing the first and the second optical devices, the carrier and the element support member; and a light guiding unit for guiding light emitted from the first optical device toward outside the package; wherein the element support member is fixed on the carrier at the first surface of the member, and the other one of the first and the second optical devices is fixed on the second surface of the element support member.

A manufacturing method of an optical transmission module according to the present invention, the optical transmission module includes a first optical device disposed in an output side, a second optical device which is disposed with its optical axis being aligned with an optical axis of the first optical device, a carrier on which either the first or the second optical device is fixed, an element support member having a first surface parallel to the optical axes and a second surface vertical to the optical axes, a package for housing the first and the second optical devices, the carrier, and the element support member, and a light guiding unit for guiding light emitted from the first optical device toward outside the package, wherein the element support member is fixed on the carrier at the first surface of the member, and the other one of the first and the second optical devices is fixed on the second surface of the element support member, the method includes the steps of:

(1) fixing either the first or the second optical device on the carrier;
(2) adjusting a position of the element support member while the other one of the first and the second optical devices closely contacts with the second surface of the device support member, and fixing the element support member on the carrier;
(3) aligning an optical axes of the first optical device and the second optical device while the other one of the first and the second optical devices is pressed on the second surface of the element support member, and fixing the other one of the first and the second optical devices on the second surface of the element support member.

Advantageous Effect of the Invention

According to the present invention, either the first or the second optical device is fixed on the carrier, and the other is closely contacted with the second surface (a surface vertical to the optical axis) of the element support member and fixed thereon. According to this structure, after the optical axis of the other optical device is aligned with the optical axis of the remaining optical device in an X-Y plain surface, the other optical device can be fixed on the surface. That can minimize a misalignment in the X and Y directions generated due to thermal extension and contraction of metal in welding of the other optical device, and can keep an angular misalignment in a low level. Further, workability in assembly processes is improved. Thus, according to the present invention, an optical transmission module in small-size, with high quality and stable characteristic can be manufactured with a high yield.

BEST MODE FOR CARRYING OUT THE INVENTION

Next, exemplary embodiments of the invention will be described in detail with reference to drawings.

[First Exemplary Embodiment]

FIG. 1 is a cross-sectional view showing an optical transmission module according to a first exemplary embodiment of the invention. FIG. 2 is a perspective view showing an optical transmission unit in the first exemplary embodiment.

As shown in FIGS. 1 and 2, an optical transmission module 1 is composed of a package 111, a peltiert device 112 which is placed in the package 111 and controls temperature of an optical transmission unit 2, the optical transmission unit 2 placed on the peltiert device 112, a fiber support 113 which is put on an opening of the package 111, a ferrule 114 supported by the fiber support 113, and an optical fiber 115 held by the ferrule 114.

The optical transmission unit 2 is composed of a carrier 116 which becomes a base, a first optical device 118 which is attached on the carrier 116 through a first sub carrier 117, a first and a second lens 120, 122 fixed on a carrier through a first and a second lens holder 119, 121, an element support member 123 and the optical isolator 124 both of which are fixed on the carrier, a third lens holder 125 supported by the element support member 123, a third lens 126 and a small carrier 127 fixed on the third lens holder 125 respectively, and a second optical device 129 attached on the small carrier 127 through a second sub carrier 128.

In the optical transmission module 1 shown in FIGS. 1 and 2, an optical signal emitted from the second optical device 129 is collected in the optical isolator 124 side through the third lens 126, and the optical signal passed through the optical isolator 124 is collected on the first optical device 118 through the second lens 122. The optical signal is amplified and emitted by the first optical device, and is injected into the optical fiber 115 through the first lens 120. The optical isolator 124 prevents the optical signal from returning to the second optical device 129. The peltiert device 112 maintains the second optical device 129 and the first optical device 118 at a constant temperature.

The element support member 123 is in a square cylindrical shape having a square shaped cross-section, and openings 123a for transmitting light are provided on two surfaces thereof facing the optical axis direction. The element support member 123 is fixed on the carrier 116 by welding at welding points 47a and 48a while a bottom surface of the member closely contacts with the carrier 116. Further, as shown in FIG. 2, the third lens holder 125 includes a lens holding part 125a in a U-shape for holding the third lens and a plate-like upright part 125b which is vertically upright and has a light transmissive hole (125a in FIG. 1). The third lens holder 125 is fixed on the element support member 123 by welding at welding points 45a and 46a while a surface in the element support member 123 side of the upright part 125b closely contacts with a side surface of the element support member 123.

The second optical device 129 is bonded on the second sub carrier 128 by die bonding using AuSn solder or the like, and the second sub carrier 128 is soldered to the small carrier 127 using the AuSn solder or the like. The third lens 126 is fixed on the third lens holder 125 by welding at welding points 41a and 42a, and the third lens holder 125 is fixed on the small carrier 127 by welding at welding points 43a and 44a. Accordingly, the second optical device unit 3 composed of the third lens holder 125, the third lens 126, the small carrier 127, the second sub carrier 128 and the second optical device 129 is fixed on the element support member 123 as a whole.

The optical isolator 124 is fixed on the carrier 116 by welding at welding points 49a and 50a. The second lens 122 is fixed on the second lens holder 121 by welding at welding points 51a and 52a. The second lens holder 121 is fixed on the carrier 116 by welding at welding points 53a and 54a. The first optical device 118 is bonded on the first sub carrier 117 by die bonding using the AuSn solder or the like, and the first sub carrier 117 is soldered to the carrier 116 with the AuSn solder or the like. The first lens 120 is fixed on the first lens holder 119 by welding at welding points 55a and 56a, and the first lens holder 119 is fixed on the carrier 116 by welding at welding points 57a and 58a.

At the welding points 41a-58a, laser welding is performed using YAG laser, for example. In FIGS. 1 and 2, welding points 41b-58b (unillustrated) are provided in an invisible opposite side from the welding points 41a-58a symmetrically. It is desirable that, as an irradiation condition for a laser beam in welding, a laser output power, a laser irradiation time, and laser output distribution for obtaining a sufficient welding strength and minimizing a misalignment in welding be examined experimentally and optimized in advance. Further details for the above will be provided. Considering minimizing a thermal contraction power generated at a coagulation and cooling stage in metal welding, that is, minimizing a misalignment due to welding, a laser output is desirably as low as possible with which the welding can be performed, and a laser irradiation time is desirably as short as possible with which the welding can be performed. In order to decrease the laser output and to shorten the laser irradiation time while welding is performable, it is effective to thin the thickness of the welding points. Further, it is desirable that laser output distribution be lowered gradually to prevent the welding points from having fissures such as cracks, or having a residual stress. The fissures and cracks at the welding points heavily affect the welding strength, and the residual stress heavily affects reliability. Since those laser irradiation conditions are affected a lot by a shape and a condition of welding point, it is desirable that the laser irradiation condition be experimentally examined and optimized at each welding point with various shapes and with the misalignments and welding stresses.

[Second Exemplary Embodiment]

FIG. 3 is a perspective view showing an optical transmission unit according to second exemplary Embodiment of the invention. The optical transmission unit 2 is mounted within a package to which a peltier device, a ferrule and the like are attached, as well as the case in the first exemplary embodiment shown in FIG. 1.

In FIG. 3, the same components as in FIG. 2 have identical reference numerals, and the same explanation will be omitted accordingly. In the exemplary embodiment, the third lens holder 125 is in a simple U-shape. The small carrier 127 is formed such that a longitudinal section of the small carrier 127, which is parallel to the optical axis, is an L-shaped. The small carrier 127 closely contacts with the element support member 123, and welded to the element support member 123 at welding point 59a and 60a. That is, in the exemplary embodiment, the small carrier 127 includes an element mounting part 127a which is parallel to the carrier 116 and an upright part 127b which rises vertically from the element mounting part 127a and is provided with a light transmissive hole. The small carrier 127 closely contacts with a side of the element support member 123 at a surface in the optical isolator 124 side of the upright part 127b, and is fixed with the element support member 123. To the element mounting part 127a of the small carrier 127, the second sub carrier 128 to which the second optical device 129 is bonded by die bonding is soldered, and in addition, the third lens holder 125 on which the third lens 126 is welded and fixed, is welded and fixed. Those of the third lens holder 125, the third lens 126, the small carrier 127, the second sub carrier 128 and the second optical device 129 composes a second optical device unit 3 which is mounted on the element support member 123.

In the second exemplary embodiment shown in FIG. 3, the optical transmission unit becomes slightly larger (within a few millimeters) in the Z direction than that of the first exemplary embodiment. The reasons can be explained with reference to FIG. 4.

Before the optical transmission unit 2 shown in FIGS. 2 and 3 is assembled, the second optical device unit 3 is assembled. At that time, the third lens 126 is aligned with the second optical device 129 (focusing). The alignment is performed, as shown in FIG. 4(a), while the third lens 126 is closely contacted with a vertical part of the third lens holder 125.

In the case of the second exemplary embodiment, a margin for adjustment is needed in between the third lens 126 and the small carrier 127 for the alignment, so that there is a gap, which is indicated with "a", in between the third lens 126 and the small carrier 127, as shown in FIG. 4(b). Therefore, due to the gap "a", the optical transmission unit of the second exemplary embodiment is slightly larger in size (within a few millimeters) than the optical transmission unit of the first exemplary embodiment in the Z direction.

[Third Exemplary Embodiment]

FIG. 5 is a perspective view of an optical transmission unit according to a third exemplary embodiment of the invention, and FIGS. 6(a) and 6(b) are cross-sectional views respectively taken along lines A-A and B-B in FIG. 5.

The optical transmission unit 2 of the third exemplary embodiment is mounted within a package to which a peltier device, a ferrule and the like are attached as well as the case in the first exemplary embodiment. In FIG. 5, the same components as in FIG. 2 have identical reference numerals, and the same explanation will be omitted accordingly.

In the exemplary embodiment, the element support member 123 includes a small carrier holding part 123a having a cross-section, which is vertical to the optical axis, of U-shaped, for housing the small carrier 127, and an upstanding part 123b having a surface vertical to the optical axis. The element support member 123 closely contacts with an upper surface of the carrier 116 at a bottom surface of the member, and is welded with the carrier 116 at the welding points 47a and 48a. The small carrier 127 is held in the small carrier holding part 123a of the element support member 123. The small carrier 127 is fixed with the element support member 123 while a side surface of the small carrier closely contacts with a surface of the upstanding part 123b of the element support member 123. The element support member 123 and the small carrier 127 are welded together at welding points 61a and 62a. Further, the upstanding part 123b of the element support member 123 is provided with openings 63a-67a for welding, and the welding with the small carrier 127 is performed at bottom parts of the openings 63a-67a.

The opening 65a for welding is a counter-bored hole in an example shown in FIG. 6(b), however, the opening 65a may be a stepped hole as shown in FIG. 6C. The upstanding part 123b of the element support member 123 is provided in an opposite side to a light emitting direction from the second optical device 129 in the exemplary embodiment, however, the upstanding part 123b may be provided inversely in a side of the light emitted direction of the second optical device 129 (namely, in an optical isolator 124 side). In the second exemplary embodiment, a collected point of outgoing light from the third lens 126 is comparatively away from the welding point where the small carrier 127 and the element support member 123 are welded. Accordingly, a strict angular alignment is required in welding. If the element support member 123 rotates 180 degrees to make the upstanding part 123b be in the optical isolator 124 side, the accuracy requirement can be eased. Further, according to a modified example shown in FIG. 8(b), which will be described later, the accuracy requirement can be eased in the same manner.

An essential point in the element support member 123 used in the present invention is that the element support member includes a surface (a first surface) fixed on the carrier closely, and a surface (a second surface) vertical to the optical axis and fixing the small carrier and the lens holder closely thereon. Thus, a shape of the element support member is not limited specifically.

FIGS. 7(a) and 7(b) are perspective views showing modified examples of the element support member 123 used in the first exemplary embodiment. In the example shown in FIG. 7(a), the element support member 123 is in a plate-like shape. Meanwhile, in the example shown in FIG. 7(b), the element support member 123 has a U-shaped cross-section. The element support member 123 shown in FIGS. 7(a) and 7(b) can be used also in the optical transmission module of the second exemplary embodiment.

FIGS. 8(a) and 8(b) are perspective views showing modified examples of the third exemplary embodiment. FIG. 8(a)

is the perspective view of the second optical device unit 3 from the optical isolator side. In FIG. 8(a), the element support member 123 includes an upright part 123c at an edge of the small carrier holding part 123a. The small carrier 127 also includes an upright part 127b at an edge of an element mounting part 127a. Further, the upright part 127b of the small carrier 127 closely contacts with the upright part 123c of the element support member 123, and the small carrier 127 is fixed on the element support member 123 by welding at welding points 68b and 69b, in addition to the welding points 61b and 62b. In the example shown in FIG. 8(b), the upright parts 123c and 127b of the element support member 123 and the small carrier 127 are provided in the optical isolator 124 side. Further, the small carrier holding part 123a has a U-shaped cross-section in the third exemplary embodiment and FIG. 8, however, the small carrier holding part may have a simple plate-like shaped cross-section so that its cross-sections vertical to the optical axis are entirely in a square shape.

In aforementioned exemplary embodiments 1-3, the second optical device section side is fixed to the element support member. However, the first optical device section side may be fixed inversely. In that case, the first optical device is mounted on the small carrier through the first sub carrier, and the second optical device is on the carrier through the second sub carrier. Further, as in the case of the first exemplary embodiment, the second lens holder is welded and fixed on the element support member, or, alternatively, as in the cases of the second and the third exemplary embodiments, the small carrier is welded and fixed on the element support member.

When the lenses, the lens holders, or the element support member is fixed with a welding measure such as the YAG laser welding in the optical transmission module according to the present invention, it is desirable that the carrier 16, the lens holders, frame parts of the lenses, and the element support member 23 be made of metal such as kovar, iron-nickel-cobalt alloy, which has a low thermal expansion coefficient and is suitable for laser welding. When those components are processed on their surface, it is desirable that at least welding points in their surface be prevented from gold plating, or have extremely thin gold plating if they need to be plated. The reason is that gold plating causes a crack and a fissure at the welding points, and welding quality becomes deteriorated. Consequently, it causes a problem for degradation of reliability. Specifically, considering that the semiconductor device is bonded on the sub carrier by die bonding using solder such as AuSn and the sub carrier is bonded on the carrier 16 by die bonding using solder such as AuSn, it is desirable that the surface of the carrier 16 be plated with gold for performing soldering with high reliability. However, the element support member 23 is generally plated with brushed nickel, and if one component of the components welded is gilded, there is large difference in the coefficients of the thermal extension between the gold plated component and components plated with other material than gold because the gold has a very high coefficient of thermal expansion. That increases the thermal contraction stress generated in welding. Thus, when a component is gilded, the plating is gilded as thinly as possible.

In a manufacturing method of an optical transmission module according to the present invention, the YAG laser welding is effectively used for fixing the element support member on the carrier, or fixing the small carrier and the lens holder on the element support member. However, welding methods other than the YAG laser welding may be used. Further, brazing, soldering, and adhesion can be used for fixing, in stead of welding. In a case with adhesion, the carrier, the lens holders, the lens frames, the element support member 23, the sub carrier and the small carrier can be made of any materials. However, those are desirably made of metal materials with a low thermal expansion coefficient, considering long-term reliability. In addition, it is desirable to use adhesive having the thermal expansion coefficient that is as close as possible to the thermal expansion coefficient of an adherend component.

In aforementioned first to third exemplary embodiments, as a specific example, the first optical device is assumed to be an optical amplifier device, and the second optical device is assumed to be a laser device. However, the present invention is not limited by the above example. For instance, a passive optical circuit device may be used as the second optical device. In that case, light emitted from the first optical device as an optical amplifier device is received by the second optical device, and it is returned to the first optical device after performing a signal processing at the second optical device. The first optical device amplifies the light returned from the second optical device, then outputs the optical signal to outside through an optical fiber. Furthermore, in aforementioned first to third exemplary embodiments, two optical devices, i.e. the first and the second optical devices, are mounted within the package. However, the number of optical devices mounted therein is not limited to be two, and three or more optical devices may be mounted. For example, the optical devices may be the one in which an optical signal emitted from a semiconductor laser device is amplified by multistage semiconductor optical amplifying elements, or the one in which an optical circuit device composing a passive optical processing circuit may be arranged in between a semiconductor laser device and a semiconductor optical amplifying device, or arranged behind an optical amplifying device. When a third optical device is provided in addition to the first and the second optical devices, the third optical device is fixed on the element support member through a small carrier or a lens holder to be placed next to the third optical device.

FIRST EXAMPLE

FIG. 9 is a cross-sectional view showing a first example of the present invention. FIG. 10 is a perspective view showing an optical transmission unit according to the first example. As shown in FIGS. 9 and 10, an optical transmission module 1 is composed of a package 11, a peltier device 12 placed in the package 11 to control temperature of an optical transmission unit 2, the optical transmission unit 2 placed on the peltier device 12, a fiber support 13 attached to an opening part of the package 11, a ferrule 14 supported by the fiber support 13, and an optical fiber 15 held by the ferrule 14.

The optical transmission unit 2 is composed of a carrier 16 which is to be a base, a semiconductor optical amplifying element 18 attached on the carrier 16 through a first sub carrier 17, a first and a second lenses 20 and 22 fixed on the carrier 16 through a first and a second lens holders 19 and 21, a element support member 23 and an optical isolator 24 which are fixed on the carrier 16, a third lens holder 25 supported by the element support member 23, a third lens 26 and a small carrier 27 which are fixed on the third lens holder 25, and a semiconductor laser device 29 attached on the small carrier 27 through a second sub carrier 28.

In the optical transmission module shown in FIGS. 1 and 2, an optical signal emitted from the semiconductor laser device 29 is collected on a side of the optical isolator 24 through the third lens 26. The optical signal passed through the optical isolator 24 is collected on the semiconductor optical amplifying element 18 through the second lens 22. The optical signal is amplified by the semiconductor optical amplifying element 18 and emitted, and is injected into the optical fiber 15 through the first lens 20. The optical isolator 24 prevents the optical signal from returning to the semiconductor laser device 29. The peltier device 12 maintains the semiconductor laser device 29 and the semiconductor optical amplifying element 18 at a constant temperature.

The element support member 23 is a square cylinder having a square shaped cross-section, and its two surfaces facing the optical axis direction are provided with openings 23a to transmit light. The element support member 23 is fixed on the carrier 16 by welding at welding points the 47a and 48a while a bottom surface of the element support member closely contacts with the carrier 16. The third lens holder 25 includes a lens holding part 25a in a U-shape for holding the third lens 26 and a plate-like upright part 25b rising vertically and provided with a light transmissive hole. The third lens holder 25 is fixed on the element support member 23 by welding at welding points the 45a and 46a while the side of the upright part 25b on the surface of an element support member 23 closely contacts with the side surface of the element support member 23.

The semiconductor laser device 29 is bonded with the second sub carrier 28 by die bonding using the AuSn solder or the like, and the second sub carrier 28 is soldered to the small carrier 27 using the AuSn solder or the like. The third lens 26 is fixed on the third lens holder 25 by welding at the welding points 41a and 42a. The third lens holder 25 is fixed on the small carrier 27 by welding at the welding points 43a and 44a. Accordingly, the second optical device unit 3 which is composed of the third lens holder 25, the third lens 26, the small carrier 27, the second sub carrier 28 and the semiconductor laser device 29 is fixed on the element support member 23 as a whole. The optical isolator 24 is fixed on the carrier 16 by welding at the welding points 49a and 50a. The second lens 22 is fixed on the second lens holder 21 by welding at the welding points 51a and 52a, and the second lens holder 21 is fixed on the carrier 16 by welding at the welding points 53a and 54a. The semiconductor optical amplifying element 18 is bonded to the first sub carrier 17 by die bonding using the AuSn solder or the like, and the first sub carrier 17 is soldered to the carrier 16 with the AuSn solder or the like. The first lens 20 is fixed on the first lens holder 19 by welding at the welding points 55a and 56a. The first lens holder 19 is fixed on the carrier 16 by welding at the welding points 57a and 58a. Laser welding is performed at the welding points 41a-58a, using the YAG laser for example. In FIGS. 1 and 2, welding points 41b-58b (unillustrated) are provided in an invisible opposite side from the welding points 41a-58a.

The welding points between the element support member 23 and the third lens holder 25 require the highest accuracy in each welding point. For convenience of illustration, the drawing shows as if those two are welded together at two points in one side. However, they are actually welded together at three points in one side, six points in total. To minimize a thermal stress which is generated at a metal solidification and cooling stage in welding, the thickness of the welding points are desirably to be thin. So, as shown in FIGS. 11(a) and 11(b), the wending points of the third lens holder 25 are provided with an opening with a taper part 25c. Accordingly, the welding can be performed even if injected laser outputs are decreased, and a misalignment and an angular misalignment along with the welding can be kept in low degree. The reason for having the opening with a thin part inside the third lens holder 25 is to prevent the size in the X direction from increasing. The shape of the opening at the welding points is not limited by the one shown in FIG. 11(b). It may be the one which has a thin part 25 as shown in FIG. 11(c). To determine the shape of the opening, it is desirable to perform an experiment and obtain a shape with which a misalignment can be suppressed at minimum.

[Assembly Method for First Example]

Next, an assembly (manufacturing) method for optical transmission module according to the first example will be explained. Firstly, the second optical device unit 3 including the semiconductor laser device 29 is assembled. The second sub carrier 28 to which the semiconductor laser device 29 is bonded by die bonding is soldered to the small carrier 27 using the AuSn solder or the like.

Next, the third lens 26 is aligned on the small carrier 27. That is, while causing the semiconductor laser device 29 to emit light, the optical fiber is placed at a position where the light from the third lens 26 is collected. The optical fiber 24 is connected to an optical power meter, and the position of the third lens 26 is adjusted so that the optical output is maximized. Then, the third lens holder 25 is inserted in between the small carrier 27 and the third lens 26. Next, the small carrier 27 and the third lens holder 25 are fixed together with the YAG laser welding, and the third lens holder 25 and the third lens 26 are fixed together with the YAG laser welding. For this type of welding, it is preferable that welding points [the welding points 41a and 41b (unillustrated), for example] which are provided to be symmetrical to each other about a vertical line passing through the optical axis are welded at the same time. After the above processes, the second optical device unit 3 including the semiconductor laser device 29 is complete.

Next, optical components on the carrier 16 such as lenses and the like are assembled. Firstly, the semiconductor optical amplifying element 18 is bonded on the first sub carrier 17 by die bonding using the AuSn solder or the like, and the first sub carrier 17 is fixed on the carrier 16 with the AuSn solder or the like. As well as the assembly of the third lens 26, the semiconductor optical amplifying element 18 emits light, and an optical fiber is placed at a position where the light from the first lens 20 is to be collected, then the optical fiber 24 is connected to an optical power meter. The position of the first lens 20 is adjusted with respect to an optical axis of the light emitted from the semiconductor optical amplifying element 18 so that the optical output is maximized. After the adjustment, the first lens holder 19 is fixed on the carrier 16 with the YAG laser welding, and the first lens 20 is fixed on the first lens holder 19 with the YAG laser welding.

As for the second lens holder 21, the second lens 22, and the carrier 16, again in the same manner, causing the semiconductor optical amplifying element 18 to emit light and an optical fiber is placed at a position where the light passing through the second lens 21 is to be collected. The optical fiber is connected to the optical power meter, and then, the second lens holder 21 is fixed on the carrier 16, and the second lens 22 is fixed on the second lens holder 21 respectively by the YAG laser welding so that the optical output is maximized.

Next, the optical isolator 24 and the second lens 22 are aligned so that the centers thereof are substantially corresponding and the light passes through the optical isolator 24. Then, the optical isolator 24 and the carrier 16 are fixed together by the YAG welding.

Next, by referring to FIGS. 12(a)-12(d), a fixing method for the element support member 23 and the second optical device unit 3 with respect to the carrier 16 will be explained.

As shown in FIG. 12(a), the element support member 23 and the third lens holder are clipped together with a clip 31 to be contacted with each other on their facing surfaces, and the second optical device unit 3 is gripped by a gripper 32. Then, the alignment is performed by moving them in the X, Y, and Z directions. That is, while causing the semiconductor laser device 29 and the semiconductor optical amplifying element 18 to emit light, and, with measuring the optical output by the optical power meter 33, the alignment for an optimal position is performed so that the optical output from the semiconductor optical amplifying element 18 is maximized.

After the alignment, as shown in FIG. 12(b), a pressure tool 34 presses the element support member 23 so that the element support member 23 and the carrier 16 closely contact with each other. The element support member 23 is fixed by the YAG laser welding while in the above state, at the welding points 47a and 47b, 48a and 48b. This welding is performed at least at each two-point provided to be symmetrical to each other about a surface passing through the optical axis and vertical to a main surface of the carrier 16, i.e. at least at four points in total, at the same time and with the same power. Accordingly, the thermal contraction power generated at the metal solidification and cooling stage in the welding can be balanced, and a misalignment and an angular alignment in the welding can be kept at the minimum. According to this welding, the position of the semiconductor laser device 29 in the Z axis direction (the optical axis direction) is fixed.

As shown in FIG. 12(c), the second optical device unit 3 is moved again in the movable X, Y directions to be adjusted its position optimally. In the adjustment, a pusher 35 pushes the third lens holder 25 and a stress for the push is increased gradually. The pusher 35 pushes the third lens holder 25 at three push areas 35a, as shown in FIG. 13(a). At that time, a barycenter of the push is made to be aligned with the optical axis as much as possible (ideally, the barycenter corresponds to the optical axis). The third lens holder 25 is pushed with its stress gradually increased while the stress to push each of the three areas is balanced and controlled so that a misalignment with the optical axis does not occur. The second optical device unit 3 is released from the gripper 32 while the pusher 35 pushes the third lens holder 25, and the welding is performed [FIG. 12(d)].

The aforementioned welding is performed firstly at the welding points 45a and 45b, shown in FIG. 13(b), which are provided to be symmetrical to each other about the optical axis which is in between the welding points 45a and 45b. Two of those points are welded at the same time and with the same power, so that the thermal contraction generated at the metal solidification and cooling stage in the welding is balanced, and thereby a misalignment of the optical axis of the third lend holder 25 can be suppressed at minimum. Next, the welding points 46-1a and 46-1b, 46-2a and 46-2b, which are line-symmetric to each other with respect to a vertical line passing through the optical axis, are welded respectively at the same time and with the same power. When distances of those welding points from a vertical line and a horizontal line passing through the optical axis are expressed by a, b, c, d, as illustrated, the relationships are defined as a=b, c=d. Further, with respect to the second and later welding, the welding may be performed at the welding points 46-1a and 46-2b at the same time, also 46-2a and 46-1b at the same time, in which the welding points in each pair are provided to be symmetric to each other about the optical axis, instead of welding the welding points 46-1a and 46-1b, 46-2a and 46-2 at the same time, in which the welding points are provided to be line-symmetric with respect to the vertical line passing through the optical axis. Note that those welding points are formed in the taper parts of the openings shown in FIGS. 11(a) and 11(b). The welding points 45a and 45b, 46-1a and 46-1b, 46-2a and 46-2b may be arranged in a same distance from the optical axis. That is, they may be arranged symmetrically on a same circle centering the optical axis.

After the components to be fixed on the carrier 16 are totally fixed, the carrier 16 is fixed on the peltier device 12 in the package 11 as shown in FIG. 9. Then, while the optical fiber 15 is connected to the optical power meter (unillustrated) with checking the optical output, the position is adjusted so that the optical output becomes the maximum. Firstly, the fiber support 13 is moved in the X and Y directions for adjustment, and the fiber support 13 is fixed on the package by the YAG laser welding. Next, the ferrule 14 is moved in the Z directions for adjustment, and then the ferrule 14 is fixed on the fiber support by the YAG laser welding.

To irradiate each of the above welding points with the YAG laser beam, a laser output, a laser irradiation time, and a laser output distribution are experimentally examined and optimized as an irradiation condition in advance so as to obtain a sufficient welding strength and minimize a misalignment generated in welding.

SECOND EXAMPLE

FIG. 14 is a perspective view showing an optical transmission unit according to second example of the invention. This optical transmission unit 2 is mounted within the package 11, as shown in FIG. 9. That is the same as the case in first example, therefore, an illustration and an explanation therefor will be omitted (that is the same in the third example and subsequent examples as well.)

The optical transmission unit 2 is composed of the carrier 16, the semiconductor optical amplifying element (unillustrated) attached on the carrier 16 through the first sub carrier 17, the first and the second lens 20 and 22 fixed on the carrier through the first and the second lens holder 19 and 21, the element support member 23 and the optical isolator 24 fixed on the carrier, and the second optical device unit 3 supported by the element support member 23. The second optical device unit 3 is composed of the small carrier 27, the semiconductor laser device 29 attached on the small carrier 27 through the second sub carrier 28, the third lens 26 fixed on the small carrier 27 through the third lens holder 25.

In the optical transmission unit 2 shown in FIG. 14, an optical signal emitted from the semiconductor laser device 29 is collected in the optical isolator 24 side though the third lens 26. The optical signal passing through the optical isolator 24 is collected on the semiconductor optical amplifying element 18 through the second lens 22. The optical signal is amplified and emitted by the semiconductor optical amplifying element 18, and is injected into the optical fiber (unillustrated) through the first lens 20. The optical isolator 24 prevents the light from returning to the semiconductor laser device 29.

The element support member 23 includes a small carrier holding part 23a having a U-shaped cross-section vertical to the optical axis for holding the small carrier 27, and an upstanding part 23b in a prismatic shape having a surface vertical to the optical axis. A bottom surface of the element support member 23 closely contacts with a top surface of the carrier 16, and it is welded to the carrier 16 at the welding points 47a and 48a. The small carrier 27 is held in the small carrier holding part 23a of the element support member 23, and a side surface vertical to the optical axis of the small carrier 27 closely contacts with a surface of the upstanding part 23b of the element support member 23, so the small carrier 27 is fixed on the element support member 23. The element support member 23 and the small carrier 27 are welded together at the welding points 61a and 62a. The upstanding part 23b of the element support member 23 is provided with the openings 63a-67a for welding, and bottoms of the openings are welded to the small carrier 27.

The semiconductor laser device 29 is bonded to the second sub carrier 28 by die bonding, and the second sub carrier 28 is fixed on the small carrier 27 by the AuSn solder or the like. The third lens 26 is fixed on the third lens holder 25 at the welding points 41a and 42a by welding, and the third lens holder 25 is fixed on the small carrier 27 by welding at the welding points 43a and 44a. The optical isolator 24 is fixed on the carrier 16 by welding at the welding points 49a and 50a. The second lens 22 is fixed on the second lens holder 21 by welding at the welding points 51a and 52a, and the second lens holder 21 is fixed on the carrier 16 by welding at the welding points 53a and 54a. The semiconductor optical amplifying element, which cannot be viewed because it is backward, is bonded to the first sub carrier 17 by die bonding using the AuSn solder or the like, and the first sub carrier 17 is soldered to the carrier 16 using the AuSn or the like. The first lens 20 is fixed on the first lens holder 19 by welding at the welding points 55a and 56a, and the first lens holder 19 is fixed on the carrier 16 by welding at the welding points at 57a and 58a. In the welding points 41a-58a, the laser welding is performed using the YAG laser, for example. In FIG. 14, the welding points 41b-44b, 47b-58b (each of them is unillustrated) are provided in an invisible opposite side to the welding points 41a-44a, 47a-58a symmetrically.

[Assembly Method for Second Example]

Next, an assembly method for the second example will be explained. The assembly method for the second optical device unit 3 and a fixing method for the optical isolator 24, the semiconductor optical amplifying element, the lenses and the like on the carrier 16 are the same as the case in first example. Hereinafter, the fixing method for the element support member 23 and the second optical device unit 3 on the carrier 16 on which the optical isolator 24, the semiconductor optical amplifying element, the lenses and the like are fixed will be explained.

While the second optical device unit 3 is gripped by a gripper and also the second optical device unit 3 is pressed, the side surface vertical to the optical axis of the small carrier 27 is closely contacted with the surface of the upstanding part 23b of the element support member 23. While in the state, both are moved in the X, Y, Z directions and adjusted.

After the alignment, the element support member 23 is closely contacted with the carrier 16 by pressing the element support member 23 on the carrier 16 by a pressing tool, and the element support member 23 is fixed in the above state by the YAG laser welding at the welding points 47a and 47b, 48a and 48b (47b, 48b are unillustrated). This welding is performed for at least at each two-point provided to be symmetric to each other about the surface passing through the optical axis and vertical to the main surface of the carrier 16, i.e. at four points in total, at the same time and under the same welding condition. Depending on this welding, the position of the semiconductor laser device 29 is fixed in the Z axis direction (an optical axis direction) and the X axis direction (a horizontal direction).

After that, the second optical device unit 3 is moved again in the movable Y direction (an upward and downward direction) to be adjusted at an optimal position. After the adjustment, the welding is performed while the element support member 23 is pressed on the carrier 16 by the pressing tool. That is, the element support member 23 and the small carrier 27 are welded together through the openings 63a-67a for welding, and then the welding points 61a and 62a, and also the welding points 61b and 62b (unillustrated) provided to be symmetric to 61a and 62a are welded together.

A different point between the first and the second example is that the fixed position of the element support member 23 of first example is changed to be set under the small carrier 27. In the present example, the semiconductor laser device 29 can be adjusted only in one direction after the element support member 23 is fixed on the carrier 16, so that the welding/fixing process for the element support member 23 in this case requires more strict accuracy than the case in first example in which the adjustment can be performed in two directions. In addition, a position on which the emitting light from the third lens 26 is collected is comparably away from a position on which the small carrier 27 and the element support member 23 are welded together in the example. Therefore, the welding is required to be performed with strict accuracy in an angular alignment.

THIRD EXAMPLE

FIG. 15 is a perspective view showing an optical transmission unit 2 according to the third example of the present invention. Roughly explaining, the semiconductor laser device and the semiconductor optical amplifying element are exchanged in the example, with respect to the first example.

As shown in FIG. 15, the optical transmission unit 2 is composed of the carrier 16, the semiconductor laser device 29 attached on the carrier 16 through the second sub carrier 28, the element support member 23 and the optical isolator 24 which are fixed on the carrier 16, and a first optical device unit 4 supported by the element support member 23. The first optical device unit 4 in this case is composed of the small carrier 27, the semiconductor optical amplifying element (unillustrated) attached on the small carrier 27 through the first sub carrier 17, the first and the second lenses 20 and 22 fixed through the first and the second lens holders 19 and 21.

In the optical transmission unit 2 shown in FIG. 15, an optical signal emitted from the semiconductor laser device 29 is collected in the optical isolator 24 side through the third lens 26, and the optical signal passing through the optical isolator 24 is collected on the semiconductor optical amplifying element through the second lens 22. The optical signal is amplified and emitted by the semiconductor optical amplifying element, and is injected into the optical fiber through the first lens 20. The optical isolator 24 prevents the optical signal from returning to the semiconductor laser device 29.

The element support member 23 is in a square cylindrical shape with a square shaped cross-section, and is provided with openings on its two surfaces facing the optical axis direction for transmitting light. The element support member 23 is fixed while a bottom surface thereof closely contacts with the carrier 16 and welded at the welding points 47b and 48b. The second lens holder 21 includes the lens holding part 21a in a U-shape for holding the second lens 22 and a plate-like upright part 21b rising upright and provided with an optical transmissive hole.

The second lens holder 21 is fixed on the element support member 23 while a surface of the upright part 21b in an element support member side closely contacted with a side surface of the element support member 23 and welded at welding points 69b and 70b. The semiconductor optical amplifying element (unillustrated) is bonded to the first sub carrier 17 by die bonding, and the first sub carrier 17 is soldered to the small carrier 27. The first lens 20 is fixed on the first lens holder 19 by welding at the welding points 55b and 56b, and the first lens holder 19 is fixed on the small carrier 27 by welding at the welding points 57b and 58b. The second lens 22 is fixed on the second lens holder 21 by welding at the welding points 51b and 52b, and the second lens holder 21 is fixed on the small carrier 27 by welding at the welding points 53b and 54b. Accordingly, the first optical device unit 4 is fixed on the element support member 23 through the second lens holder 21.

The optical isolator 24 is fixed on the carrier 16 by welding at unillustrated welding points (49b and 50b) using the AuSn solder or the like. The third lens 26 is fixed on the third lens holder 25 by welding at the welding points 41b and 42b, and the third lens holder 25 is fixed on the carrier 16 by welding at the welding points 43b and 44b. Further, the semiconductor laser device 29 is bonded to the second sub carrier 28 by die bonding, and the second sub carrier 28 is soldered to the carrier 16. In FIG. 15, the welding points 41a-44a, 47a-58a, 69a, 70a (each of them is unillustrated) are provided on an invisible opposite side from the welding points 41b-44b, 47b-58b, 69b, 70b symmetrically.

An assembly method of the present example is the same as the case in the first example, so that a detailed explanation will be omitted. The first optical device unit 4 and the element support member 23 are moved in the X, Y, and Z directions to be aligned, and then the element support member 23 is welded and fixed on the carrier 16 while the element support member 23 is pressed on the carrier 16. Next, the alignment is performed again, and the second lens holder 21 is welded and fixed on the element support member 23 while the first optical device unit 4 is pressed on the element support member 23.

FOURTH EXAMPLE 4

FIG. 16 is a perspective view showing an optical transmission unit according to the fourth example of the present invention. The fourth example is different from the third example in that the position of the element support member in the third example is changed to be set under the small carrier 27. The element support member used in the present example is the same as in the second example, therefore, a relationship between the present example and the third example is the same as the one between first and second example.

As shown in FIG. 16, the optical transmission unit 2 is composed of the carrier 16 to be a base, the semiconductor laser device 29 attached on the carrier 16 through the second sub carrier 28, the element support member 23 and the optical isolator 24 which are fixed on the carrier 16, and the first optical device unit 4 supported by the element support member 23. The first optical device unit 4 is composed of the small carrier 27, the semiconductor optical amplifying element (unillustrated) attached on the small carrier 27 through the first sub carrier 17, and the first and the second lenses 20 and 22 fixed through the first and second lens holders 19 and 21.

The element support member 23 includes the small carrier holding part 23a having the U-shaped cross-section vertical to the optical axis for holding the small carrier 27, and the upstanding part 23b in a prismatic shape having a surface vertical to the optical axis. A bottom surface of the element support member 23 closely contacts with an upper surface of the carrier 16, and welded to the carrier 16 at the welding points 47b and 48b. The small carrier 27 is held in the small carrier holding part 23a of the element support member 23, and the side surface vertical to the optical axis of the small carrier 27 closely contacts with the surface of the upstanding part 23b of the element support member 23, and the small carrier is fixed on the element support member 23. The element support member 23 and the small carrier 27 are welded together at the welding points 61b and 62b. Further, the upstanding part 23b of the element support member 23 is provided with openings 63a-67a for welding, and the welding with the small carrier 27 is performed at bottoms of the openings.

The semiconductor optical amplifying element which is behind and cannot be viewed is bonded to the first sub carrier 17 by die bonding, and the first sub carrier 17 is soldered to the small carrier 27 using the AuSn solder or the like. The first lens 20 is fixed on the first lens holder 19 by welding at the welding points 55b and 56b, and the first lens holder 19 is fixed on the small carrier 27 by welding at the welding points 57b and 58b. Further, the second lens 22 is fixed on the second lens holder 21 by welding at the welding points 51b and 52b, and the second lens holder 21 is fixed on the small carrier 27 by welding at the welding points 53b and 54b.

The optical isolator 24 is fixed on the carrier 16 by welding at the welding points 49b and 50b. The third lens 26 is fixed on the third lens holder 25 by welding at the welding points 41b and 42b. The third lens holder 25 is fixed on the carrier 16 by welding at the welding points 43b and 44b. The semiconductor laser device 29 is bonded to the second sub carrier 28 by die bonding, and the second sub carrier 28 is soldered to the carrier 16 with the AuSn solder or the like. Note that in FIG. 16, the welding points 41a-44a, 47a-58a (each of them is unillustrated) are provided in an invisible opposite side from the welding points 41b-44b, 47b-58b symmetrically.

FIFTH EXAMPLE

FIG. 17 is a perspective view showing an optical transmission unit according to the fifth example of the present invention. In the optical transmission module of the present example, a passive planar lightwave circuit is mounted instead of the semiconductor laser device.

The optical transmission unit 2 of the present example is composed of the carrier 16, the semiconductor optical amplifying element (unillustrated) attached on the carrier 16 through the first sub carrier 17, the first and the second lenses 20 and 22 fixed on the carrier through the first and the second lens holders 19 and 21, the element support member 23 fixed on the carrier, and the second optical device unit 3 supported by the element support member 23. The second optical device unit 3 is composed of the small carrier 27, and the planar lightwave circuit 30 attached on the small carrier 27.

In the optical transmission unit 2 shown in FIG. 17, an optical signal emitted from the semiconductor optical amplifying element at its end in the second lens 22 side is collected on the planar lightwave circuit 30 through the second lens 22 and light transmissive holes of the element support member 23 and a small carrier 27. The optical signal is processed in this circuit, and is returned to the semiconductor optical amplifying element. The optical signal is amplified and emitted by the semiconductor optical amplifying element, and is injected into the optical fiber (unillustrated) through the first lens 20.

The element support member 23 of the present example is a plate-like structural object having an opening for transmitting light, and its bottom surface closely contacts with an upper surface of the carrier 16, and is welded to the carrier 16 at the welding points 47a and 48a. Further, the small carrier 27 of the present example includes an element mounting part 27a parallel to the carrier 16 and an upright part 27b rising vertically from the element mounting part 27a and having an optical transmissive hole. The small carrier 27 closely contacts with a main surface of the element support member 23 at its surface of the upright part 27b in a semiconductor optical amplifier side, and is fixed on the element support member 23 by welding at the welding points 59a and 60a.

The second lens 22 is fixed on the second lens holder 21 by welding at the welding points 51a (unillustrated), 52a, and the second lens holder 21 is fixed on the carrier 16 by welding at the welding point 53a (unillustrated) and 54a. The semiconductor optical amplifying element (unillustrated) is bonded to the first sub carrier 17 by die bonding, and the first sub carrier 17 is soldered to the carrier 16. The first lens 20 is fixed on the first lens holder 19 by welding at the welding points 55a and 56a, and the first lens holder 19 is fixed on the carrier 16 by welding at welding points 57a and 58a. In FIG. 17, the welding points 47b, 48b, 51b-60b (each of them is unillustrated) are provided in an invisible opposite side from the welding points 47a, 48a, 51a-60a symmetrically.

[Assembly Method for Fifth Example]

Next, an assembly method for the fifth example will be explained. The planar lightwave circuit 30 is mounted on the element mounting part 27a of the small carrier 27 so as to compose the second optical device unit 3, and the semiconductor optical amplifying element, the first and the second lenses, and the first and the second lens holders are mounted on the carrier 16 as in the same manner with the first example.

While causing the semiconductor optical amplifying element to emit light, the second optical device unit 3 is gripped by a gripper in a state in which facing surfaces of the small carrier 27 and the element support member 23 closely contact with each other. The second optical device unit 3 is then moved in the X, Y, and Z directions and adjusted so that an optical output becomes the maximum. After the adjustment, the element support member 23 is pressed on the carrier 16 by the pressing tool so that the element support member 23 and the carrier 16 closely contacts with each other. Then, the element support member 23 is fixed in the above mentioned state by welding at the welding points 47a and 47b, 48a and 48b (47b and 48b are unillustrated) with the YAG laser welding.

After that, the second optical device unit 3 is moved again in the movable X and Y directions to be adjusted at an optimal position. After the adjustment, the element support member 23 and the small carrier 27 is welded at the welding points 59a and 60a while the small carrier 27 is pressed on the element support member 23 by a pressing tool.

In the present example, the element support member 23 is arranged between the second lens 22 and the planar lightwave circuit 30, so that a displacement of an injecting position for the emitted light, which is caused by an angular misalignment in welding, can be reduced.

SIXTH EXAMPLE

FIG. 18 is a perspective view of an optical transmission unit 2 according to the sixth example of the present invention. The sixth example is different from the fifth example in that the position of the element support member in the fifth example is changed and is placed under the small carrier 27. The element support member used in the present example is the same as the one in the sixth example. Therefore, the sixth example and the fifth example are in the same relationship of the second and the first examples 2 and 1.

As shown in FIG. 18, the optical transmission unit 2 in the exemplary embodiment is composed of the carrier 16, the semiconductor optical amplifying element (unillustrated) attached on the carrier 16 through the first sub carrier 17, the first and the second lenses 20 and 22 fixed on the carrier through the first and the second lens holders 19 and 21, the element support member 23 fixed on the carrier 16, and the second optical device unit 3 supported by the element support member 23. The second optical device unit 3 is composed of the small carrier 27, and the planar lightwave circuit 30 attached on the small carrier 27.

A bottom surface of the element support member 23 closely contacts with an upper surface of the carrier 16, and is welded to the carrier 16 at the welding points 47a and 48a. The small carrier 27 held by the small carrier holding part 23a of the element support member 23 is fixed on the element support member 23 while a small carrier's side surface vertical to the optical axis closely contacts with the surface of the upstanding part 23b of the element support member 23. The element support member 23 and the small carrier 27 are welded at the welding points 61a and 62a. Further, the upstanding part 23b of the element support member 23 is provided with the opening 63a-67a for welding, and the welding to the small carrier 27 is performed at bottoms of the openings.

The second lens 22 is fixed on the second lens holder 21 by welding at the welding points 51a and 52a, and the second lens holder 21 is fixed on the carrier 16 by welding at the welding points 53a and 54a. The semiconductor optical amplifying element is bonded to the first sub carrier 17 by die bonding, and the first sub carrier 17 is soldered to the carrier 16. The first lens 20 is fixed on the first lens holder by welding at the welding points 55a and 56a, and the first lens holder 19 is fixed on the carrier 16 by welding at the welding points 57a and 58a. In FIG. 18, the welding points 47b, 48b, 51b-58 (each of them is unillustrated) are provided in an invisible opposite side from the welding points 47a, 48a, 51a-58a symmetrically.

SEVENTH EXAMPLE

FIG. 19 is a perspective view showing an optical transmission unit 2 according to the seventh example of the present invention. Roughly explaining, in the present example, the planar lightwave circuit changes its position with the semiconductor optical amplifying element in the fifth example. As shown in FIG. 19, the optical transmission unit 2 is composed of the carrier 16, the planar lightwave circuit 30 attached on the carrier 16, the element support member 23 fixed on the carrier 16, and the first optical device unit 4 supported by the element support member 23. The first optical device unit 4 is composed of the small carrier 27, the semiconductor optical amplifying element (unillustrated) attached on the small carrier 27 through the first sub carrier 17, the first and the second lenses 20 and 22 fixed through the first and second lens holders 19 and 21.

The element support member 23 of the present example is a plate-like structural object having an opening for transmitting light, and a bottom thereof closely contacts with an upper surface of the carrier 16, and is welded with the carrier 16 at the welding points 47b and 48b. Further, the second lens holder 21 includes the lens holding part 21a in a U-shape for holding the second lens 22 and the platy upright part 21b rising vertically and provided with an optical transmissive hole. While a surface of upright part 21b in an element support member 23 side closely contacts with a main surface of the element support member 23, the upright part is fixed on the element support member 23 by welding at the welding points 69b and 70b. The semiconductor optical amplifying element (unillustrated) is bonded to the first sub carrier 17 by die bonding, and the first sub carrier 17 is soldered to the small carrier 27 with the AuSn solder or the like.

The first lens 20 is fixed on the first lens holder 19 by welding at the welding points 55b and 56b, the first lens holder 19 is fixed on the small carrier 27 by welding at the welding points 57b and 58b. The second lens 22 is fixed on the second lens holder 21 by welding at the welding points 51b and 52b, the second lens holder 21 is fixed on the small carrier 27 by welding at the welding points at 53b and 54b. Accordingly, the first optical device unit 4 is fixed with the element support member 23 through the second lens holder 21.

An assembly method for the present example is the same as in the third example. In FIG. 19, the welding points 47a, 48a, 51a-58a, 69a, 70a (each of them is unillustrated) are provided in an invisible opposite side from the welding points 47b, 48b, 51b-58b, 69b, 70b symmetrically.

FIG. 20 is a perspective view showing an optical transmission unit 2 according to the eighth example of the invention. The eighth example is different from the seventh example in that the position of the element support member of seventh example is changed and is placed under the small carrier 27. The element support member used in the present example is the same as the one in the sixth example. Therefore, a relationship between the present example and the seventh example is the same as in the fifth and the sixth examples.

As shown in FIG. 20, the optical transmission unit 2 of the present example is composed of the carrier 16, the planar lightwave circuit 30 attached on the carrier 16, the element support member 23 fixed on the carrier 16, and the first optical device unit 4 supported by the element support member 23. The first optical device unit 4 is composed of the small carrier 27, the semiconductor optical amplifying element (unillustrated) attached on the small carrier 27 through the first sub carrier 17, and the first and the second lenses 20 and 22 fixed through the first and the second lens holders 19 and 21.

A bottom surface of the element support member 23 closely contacts with an upper surface of the carrier 16, and the element support member is welded to the carrier 16 at the welding points 47b and 48b. The small carrier 27 is held in the small carrier holding part 23a of the element support member 23, and a side surface of the small carrier 27, which is vertical to the optical axis, closely contacts with the surface of the upstanding part 23b of the element support member 23, and is fixed on the element support member 23. The element support member 23 and the small carrier 27 are welded together at the welding points 61b and 62b. The upstanding part 23b of the element support member 23 is provided with the openings 63a-67a for welding, and the welding to the small carrier 27 is performed at bottoms of those openings.

The semiconductor optical amplifying element (unillustrated) is bonded to the first sub carrier 17 by die bonding, the first sub carrier 17 is soldered on the small carrier 27 with the AuSn solder or the like. The first lens 20 is fixed on the first lens holder 19 by welding at the welding points 55b and 56b, and the first lens holder 19 is fixed on the small carrier 27 by welding at the welding points 57b and 58b. The second lens 22 is fixed on the second lens holder 21 by welding at welding points 51b and 52b, and the second lens holder 21 is fixed on the small carrier 27 by welding at welding points 53b and 54b.

An assembly method for the present example is the same as the case in the fourth example. In FIG. 20, the welding points 47a, 48a, 51a-58 (each of them are unillustrated) are provided in an invisible opposite side from the welding points 47b, 48b, 51b-58b symmetrically.

INDUSTRIAL APPLICABILITY

According to the present invention, either the first or the second optical devices is fixed on the carrier, and the other one is fixed on the element support member while its second surface (vertical to the optical axis) closely contacts with the element support member. Thus, the other optical device can be fixed in the X-Y plane after alignment with the optical axis of the one optical device.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2005-264723, filed on Sep. 13, 2005, the disclosure of which is incorporated herein in its entirety by reference.

DESCRIPTION OF THE CODES

Figure 1:
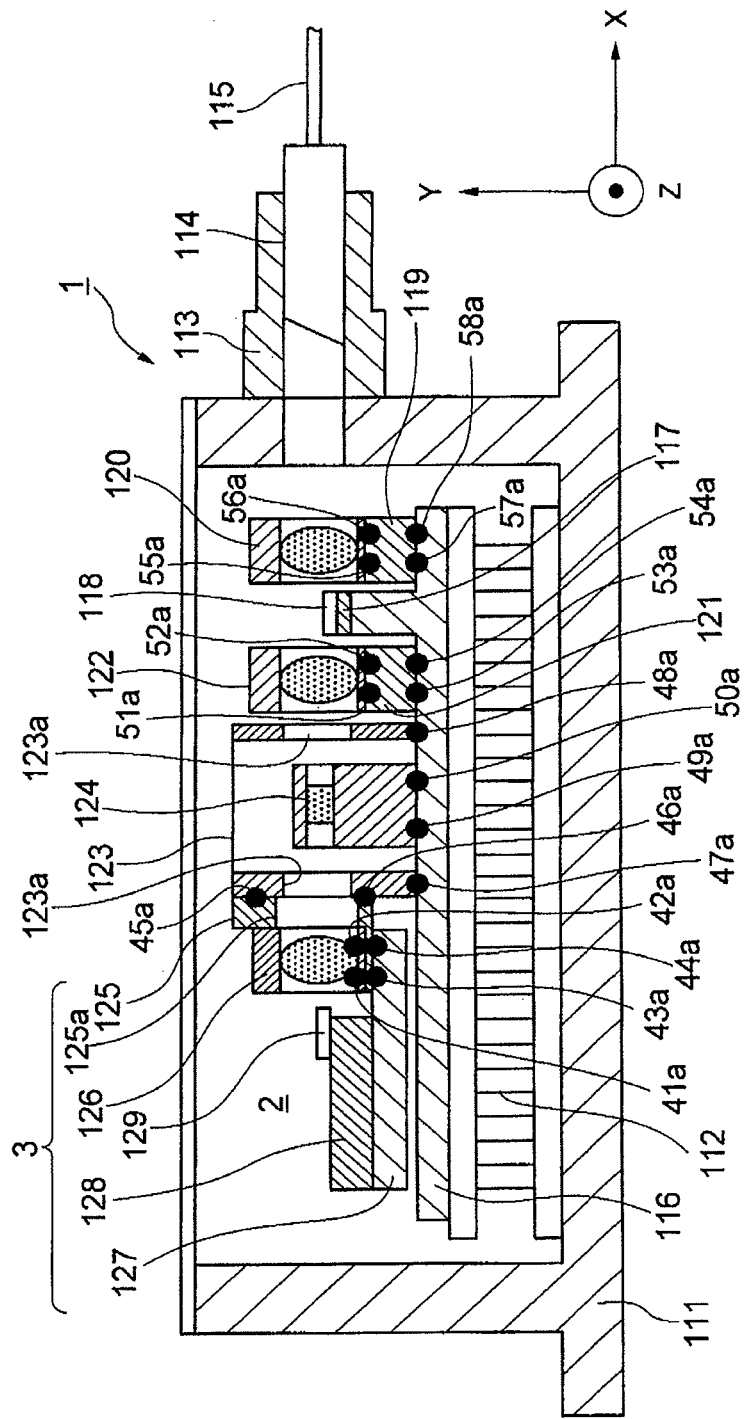
[FIG. 1] A cross-sectional view showing an optical transmission module according to a first exemplary embodiment of the invention.
Figure 2:
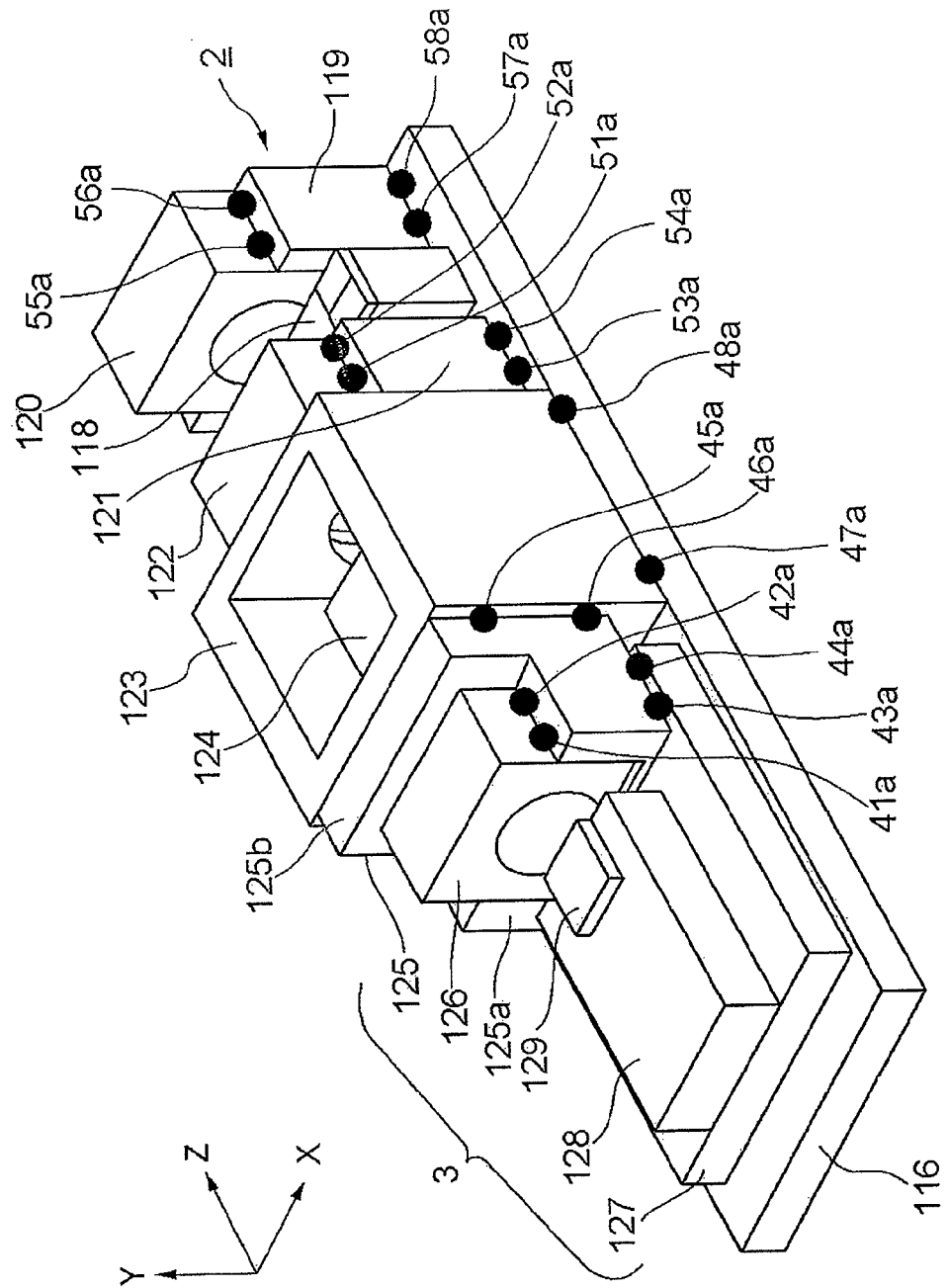
[FIG. 2] A perspective view showing an optical transmission unit according to the first exemplary embodiment of the present invention.
Figure 3:
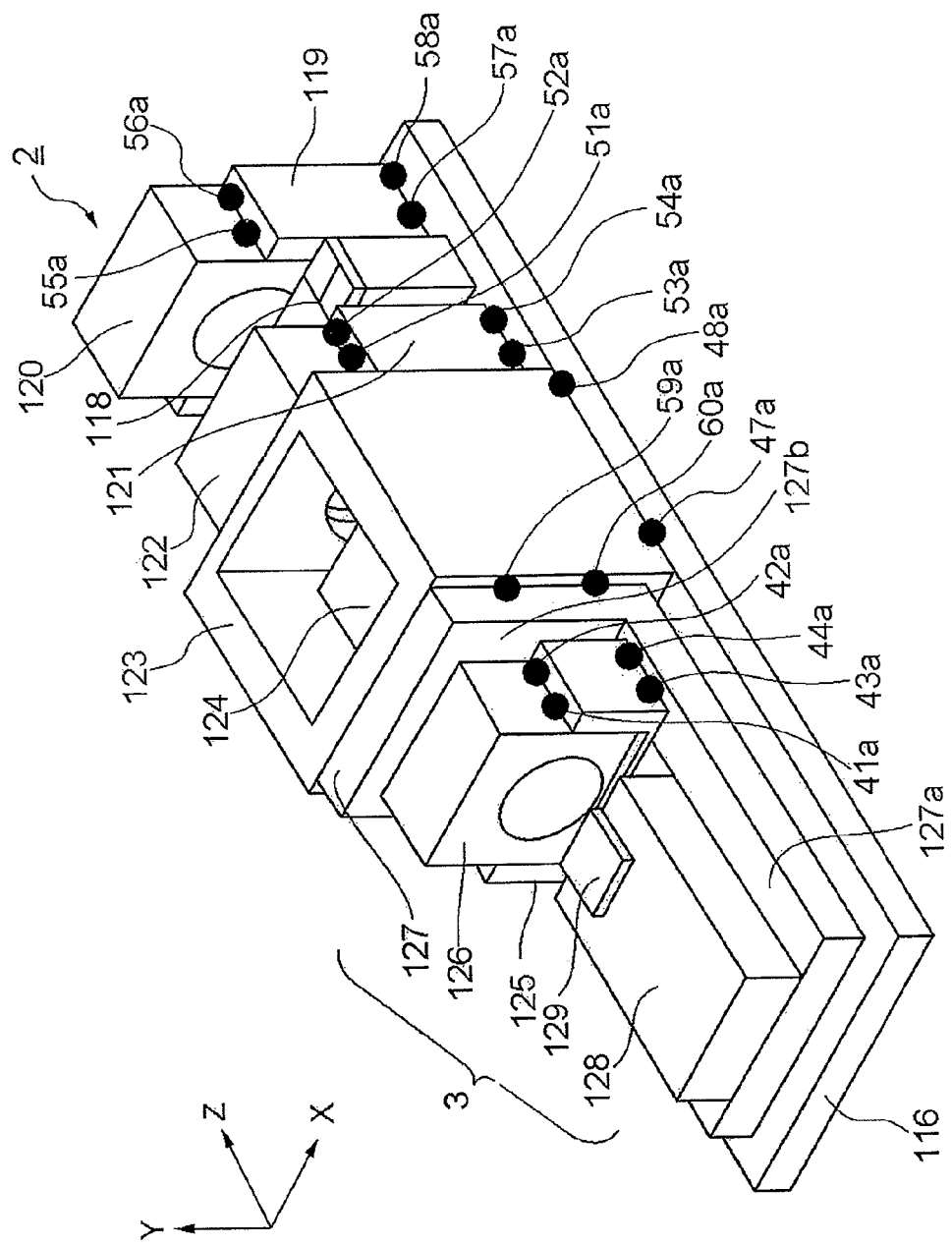
[FIG. 3] A perspective view showing an optical transmission unit according to a second exemplary embodiment of the present invention.
Figure 4A:
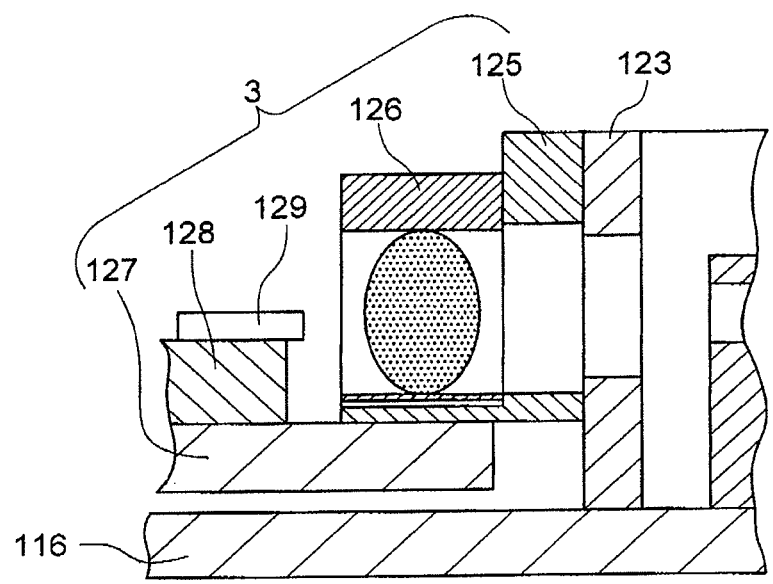
[FIG. 4] A cross-sectional view explaining a difference between the first and the second exemplary embodiments.
Figure 4B:
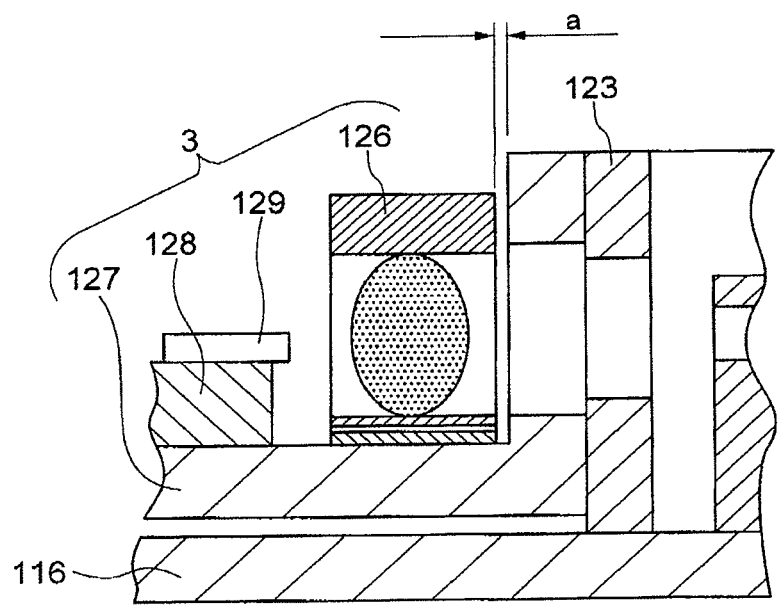
Figure 5:
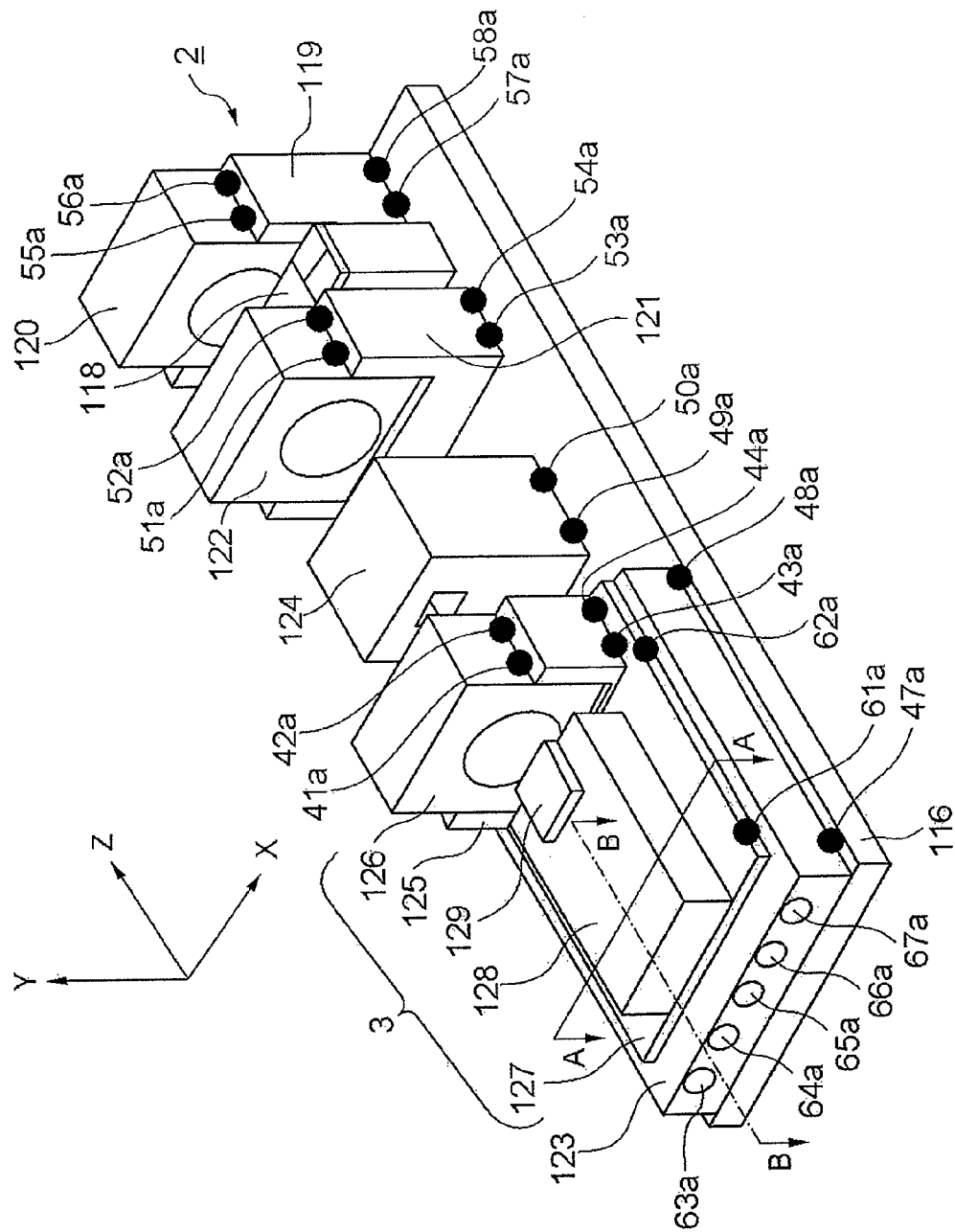
[FIG. 5] A perspective view showing an optical transmission unit according to a third exemplary embodiment of the invention.
Figure 6A:
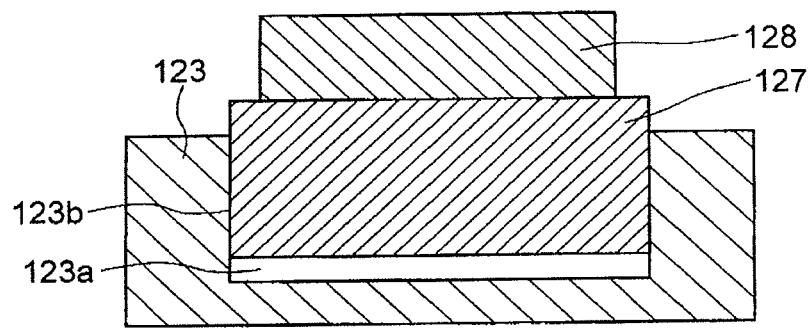
FIG. 6(a) is a cross-sectional view taken along line A-A in FIG. 5.
Figure 6B:
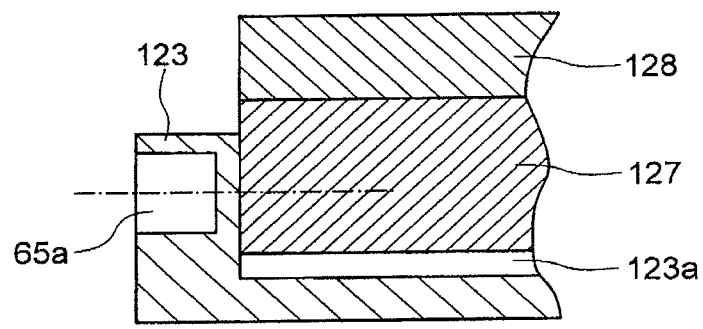
FIG. 6(b) is a cross-sectional view taken along line B-B in FIG. 5.
Figure 6C:
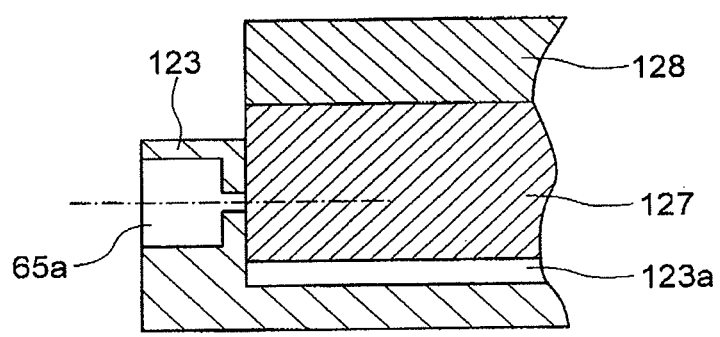
[FIG. 6]
Figure 7A:
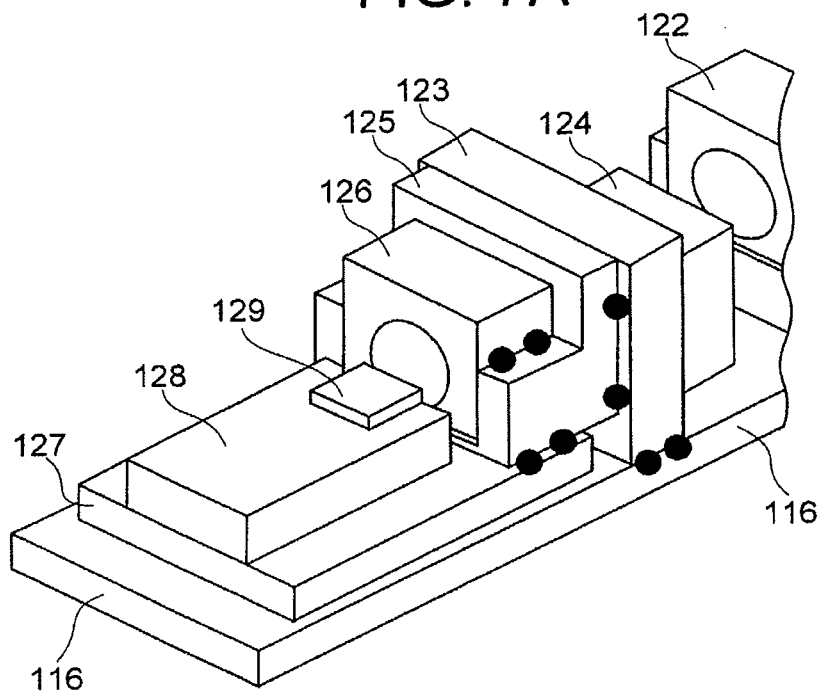
[FIG. 7] A perspective view showing a modified first exemplary embodiment.
Figure 7B:
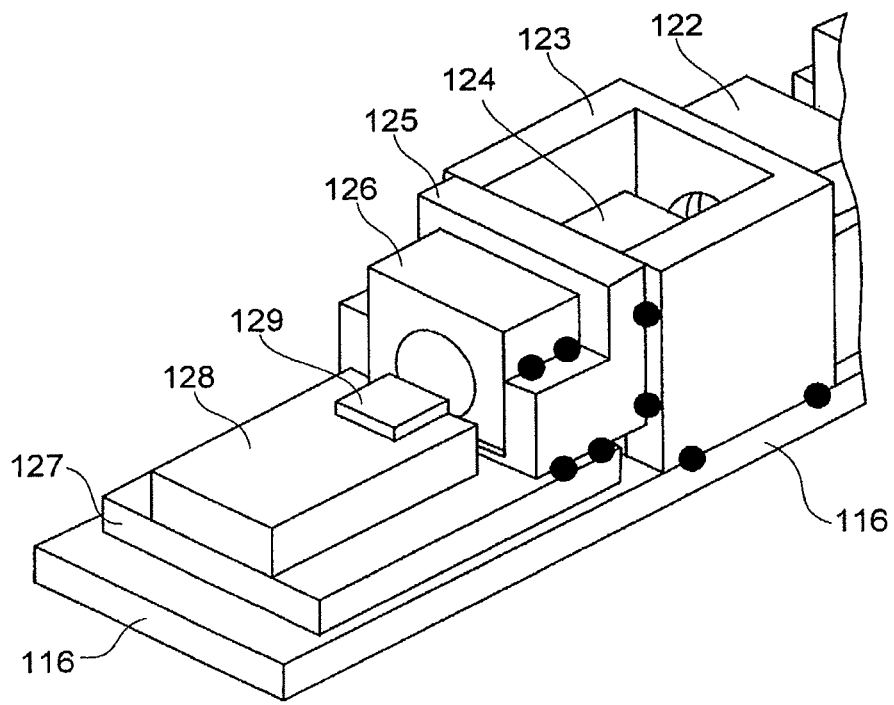
Figure 8A:
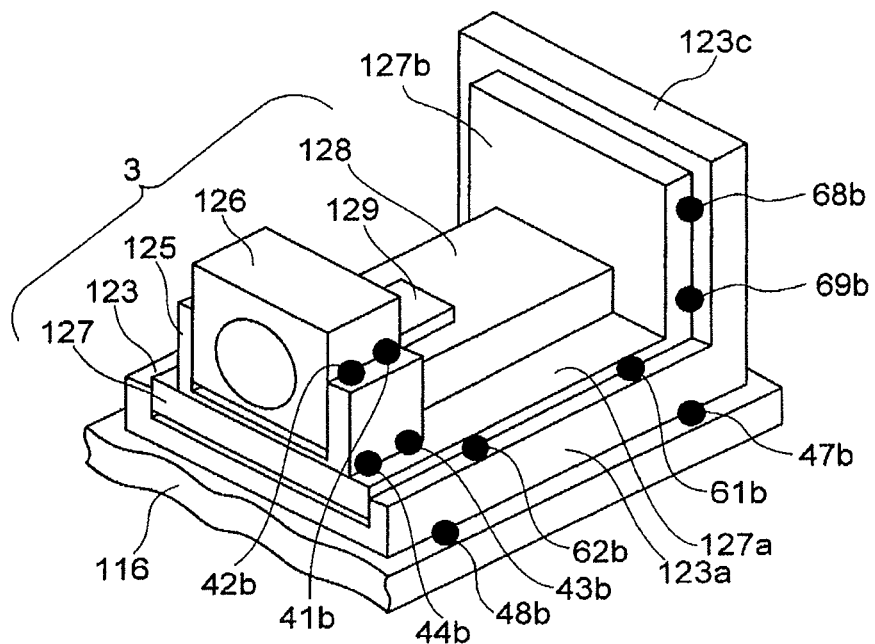
[FIG. 8] A perspective view showing a modified third exemplary embodiment.
Figure 8B:
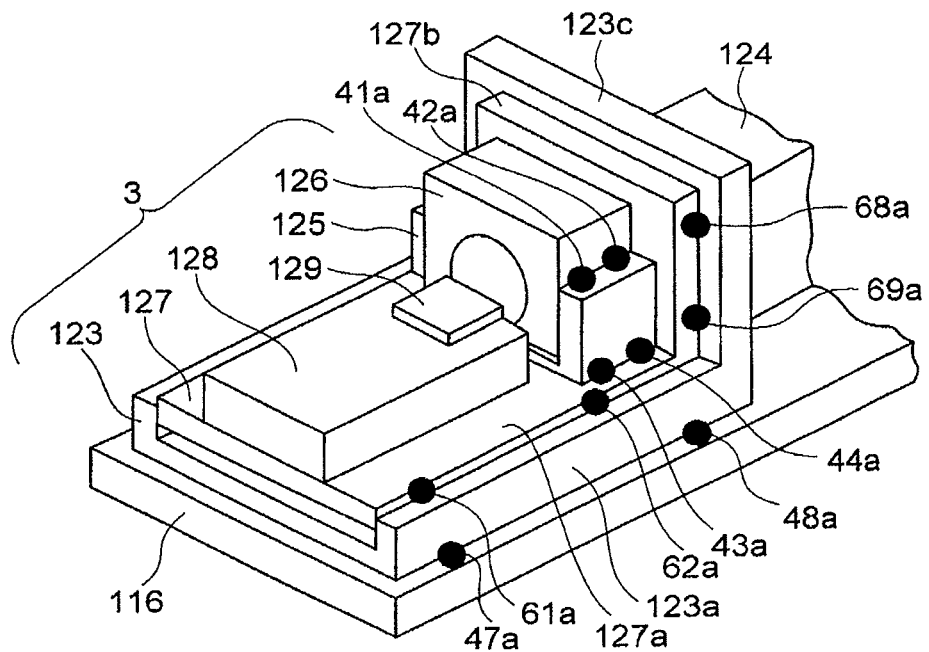
Figure 9:
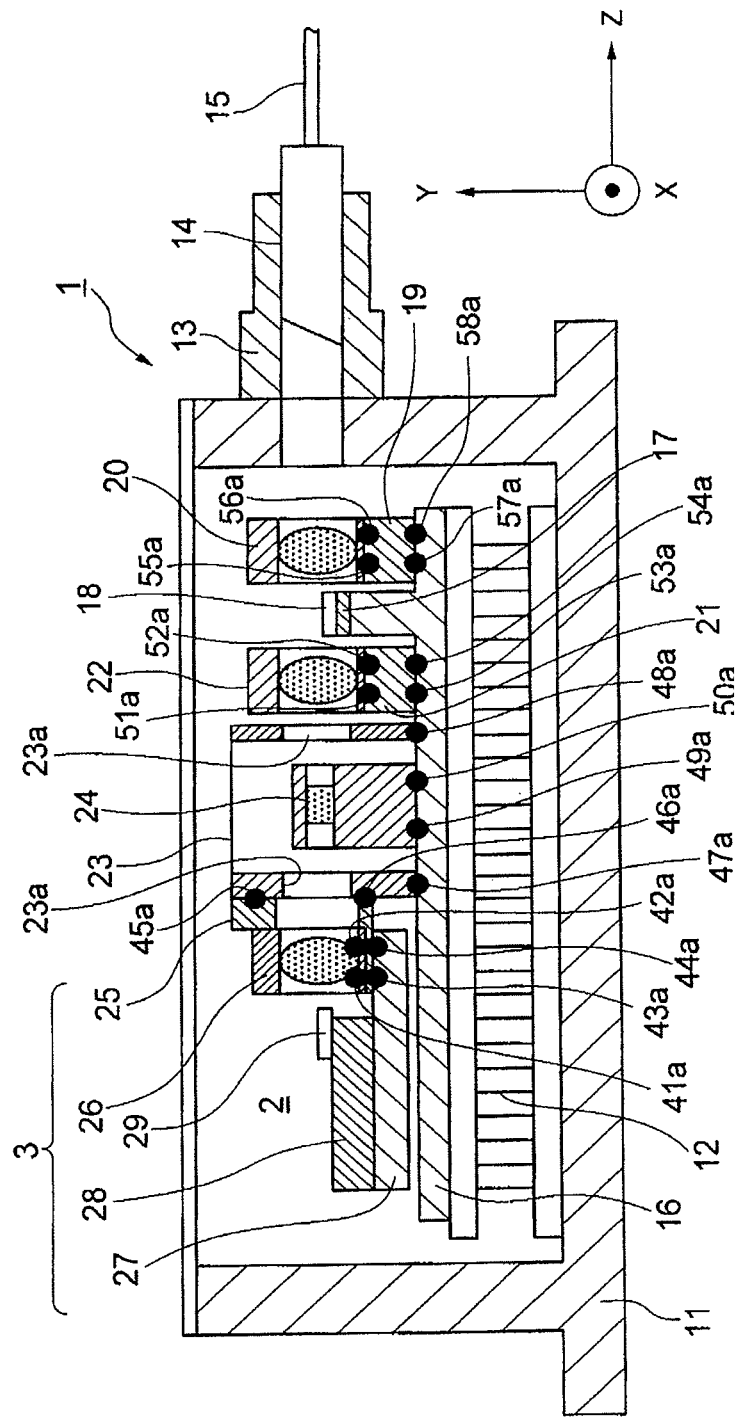
[FIG. 9] A cross-sectional view showing an optical transmission module according to a first example.
Figure 10:
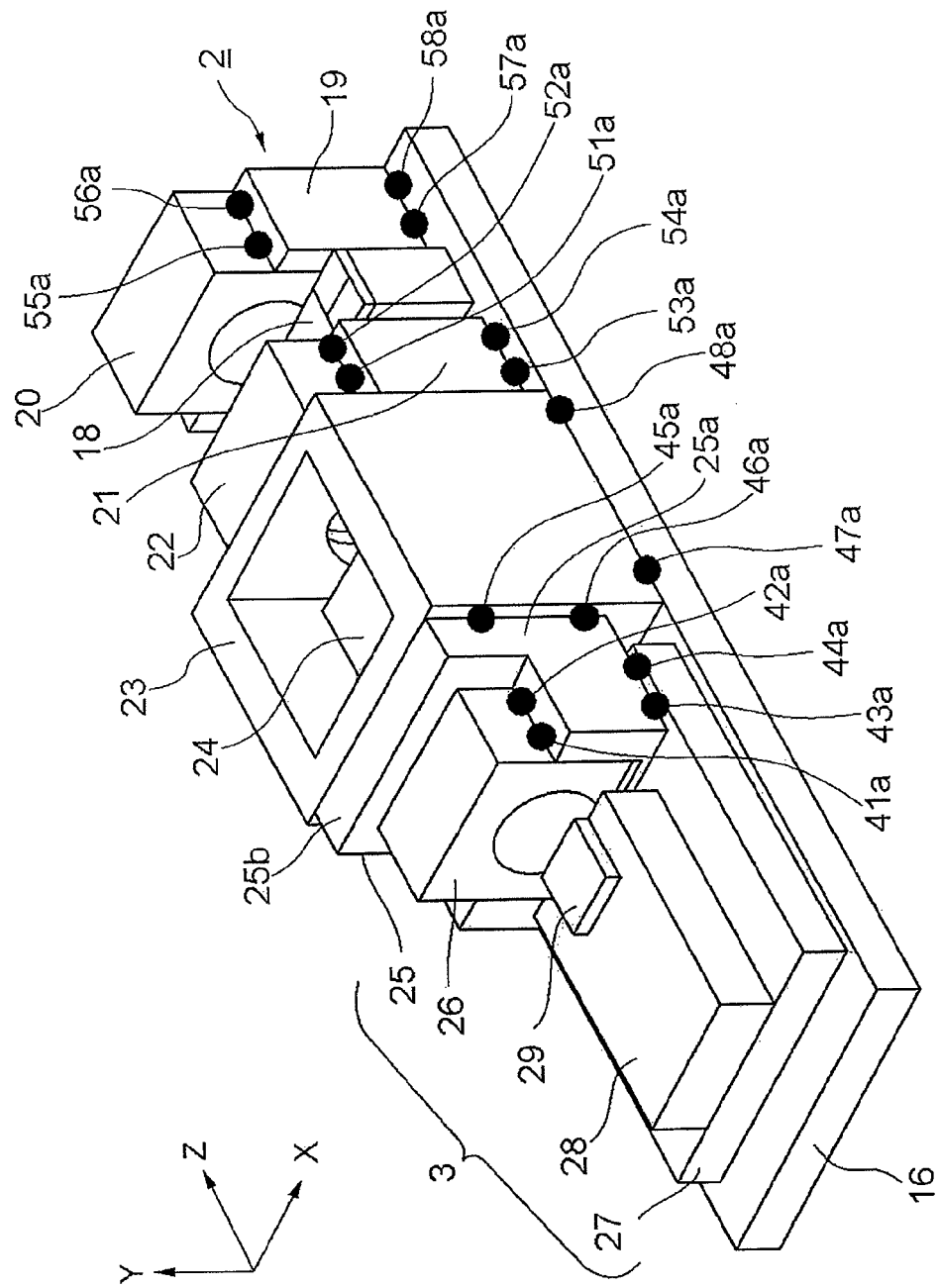
[FIG. 10] A perspective view showing an optical transmission unit according to the first example.
Figure 11A:
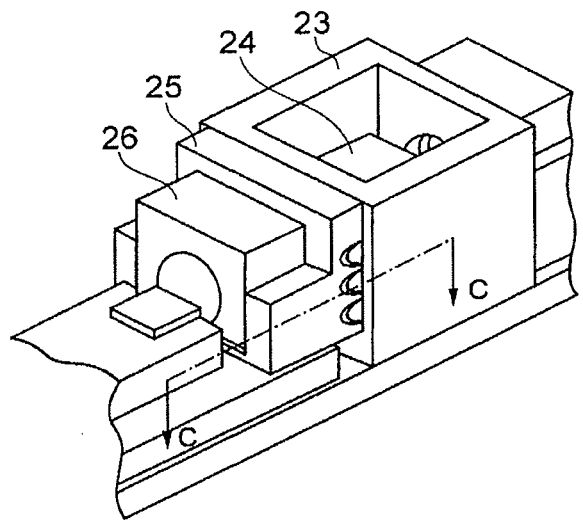
[FIG. 11] FIG 11.(a) is a perspective view explaining a welding point between the element support member and the third lens holder in the first example.
FIGS. 11(b) and 11(c) are cross-sectional views for the same.
Figure 11B:
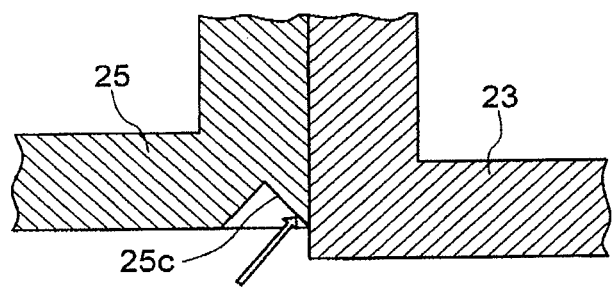
Figure 11C:
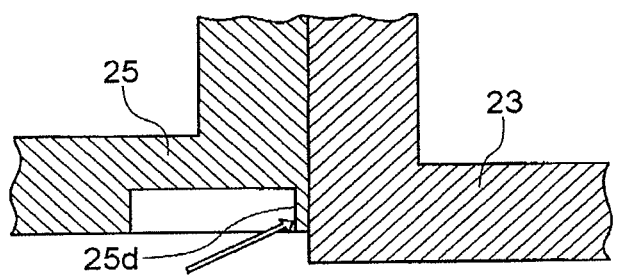
Figure 12A:
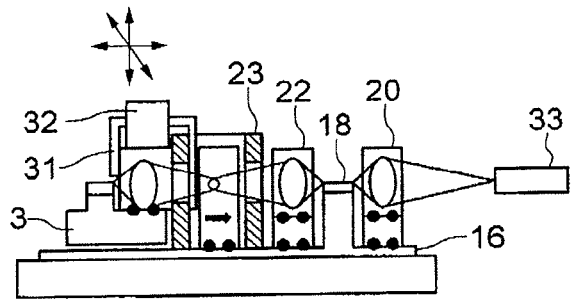
[FIG. 12] Cross-sectional views showing an assembly method for the first example in its process sequence.
Figure 12B:
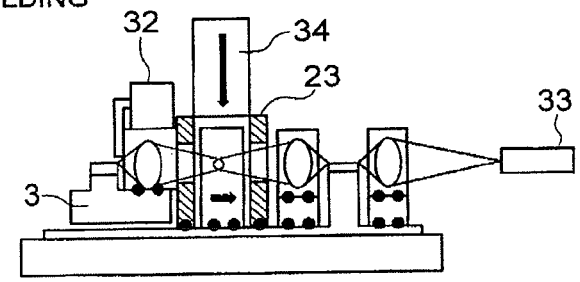
Figure 12C:
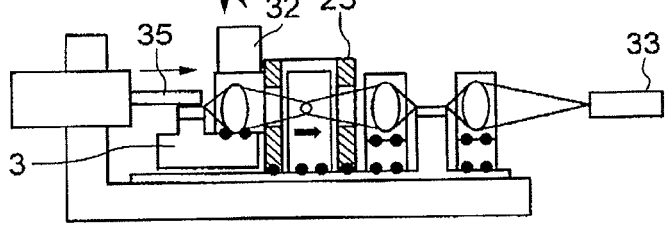
Figure 12D:
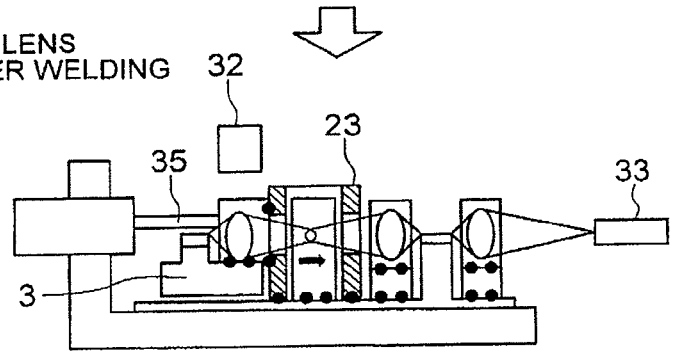
Figure 13A:
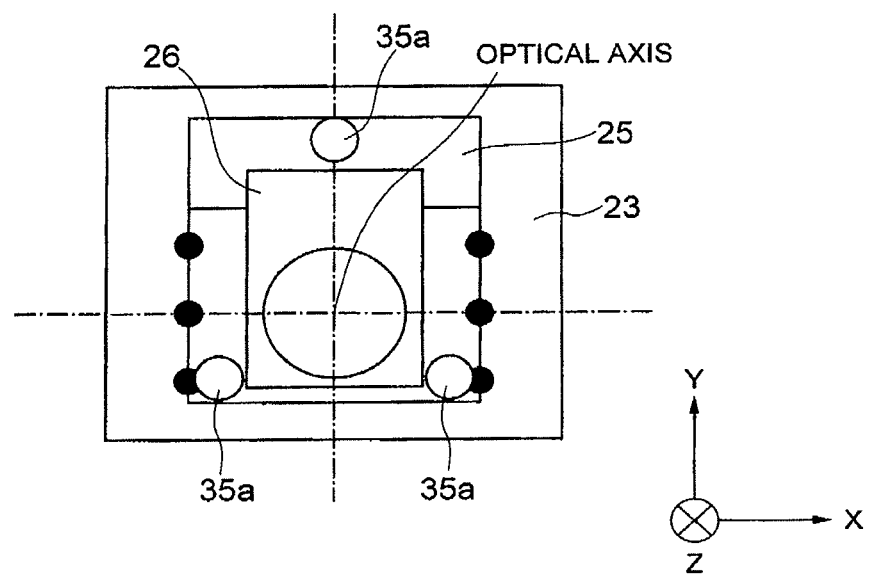
[FIG. 13] Front views explaining welding processes between the element support member and the third lens holder in the first example.
Figure 13B:
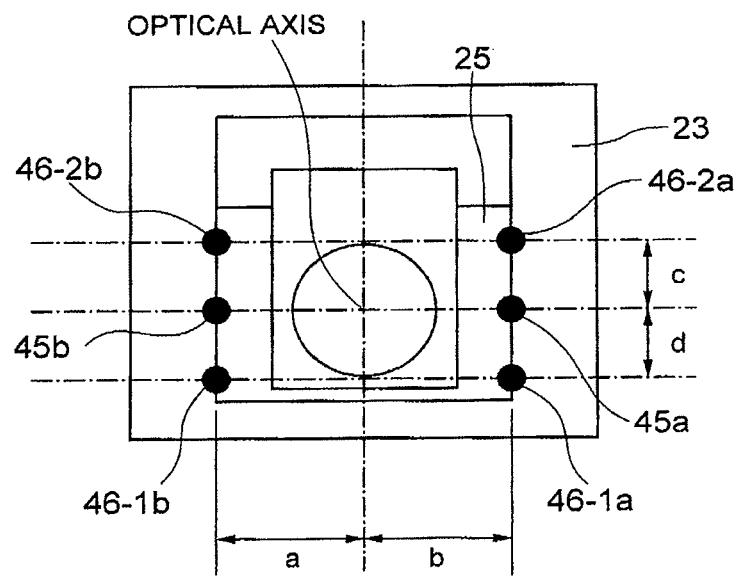
Figure 14:
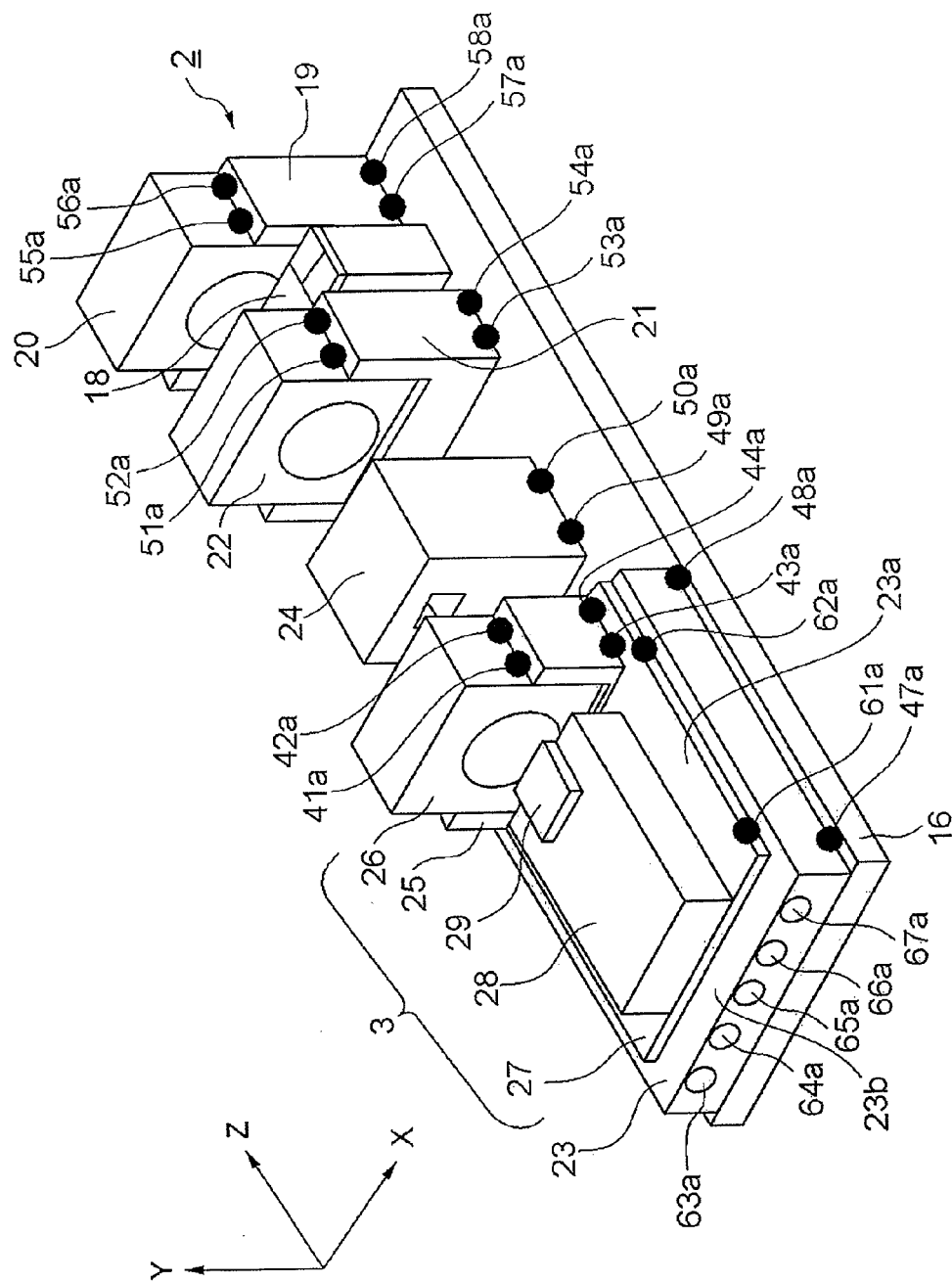
[FIG. 14] A perspective view showing an optical transmission unit according to the second example.
Figure 15:
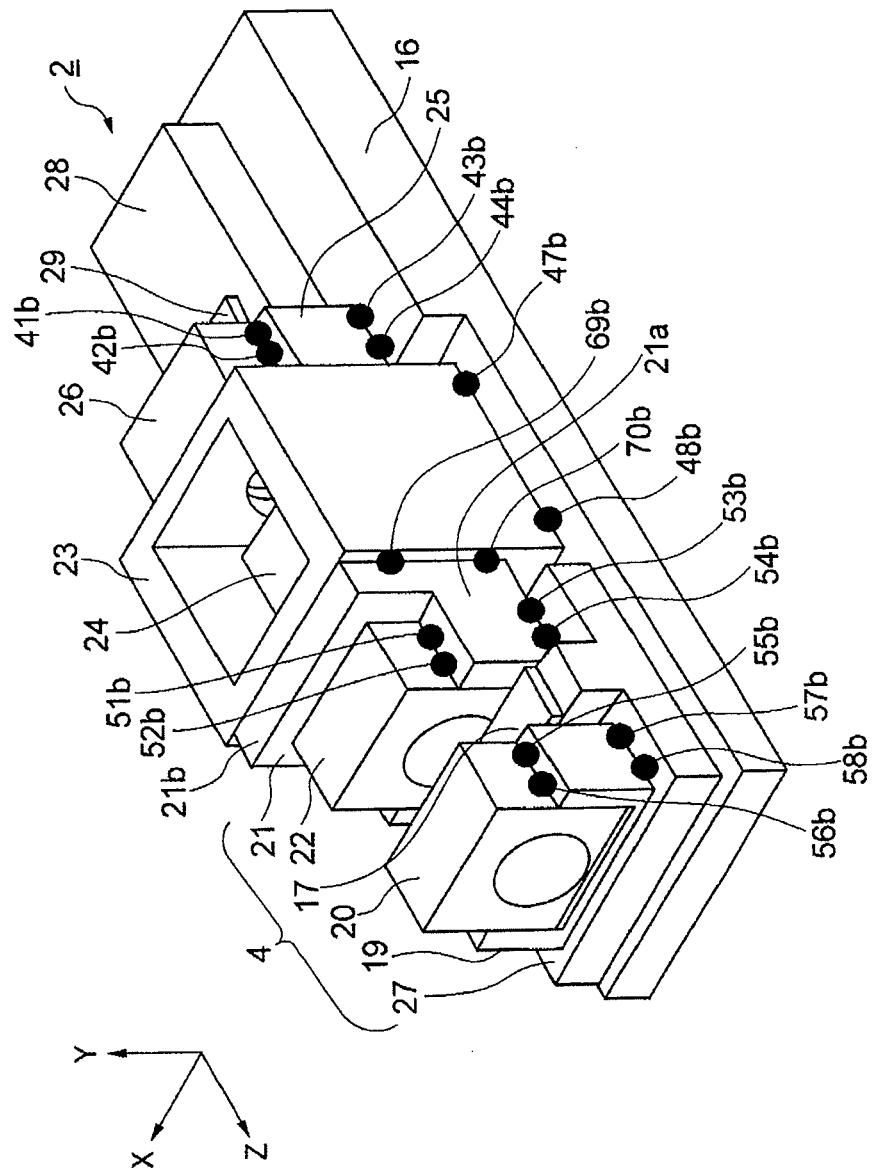
[FIG. 15] A perspective view showing an optical transmission unit according to the third example.
Figure 16:
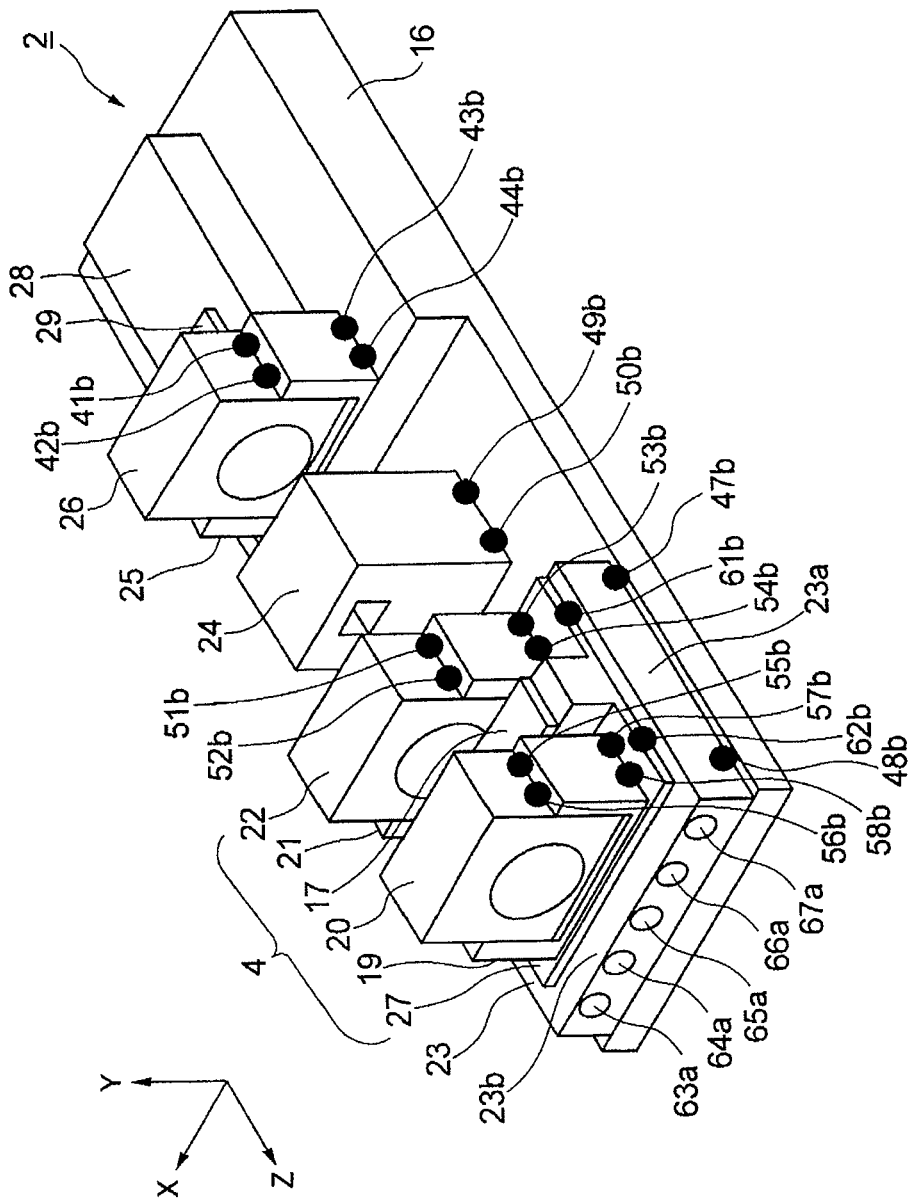
[FIG. 16] A perspective view showing an optical transmission unit according to the fourth example.
Figure 17:
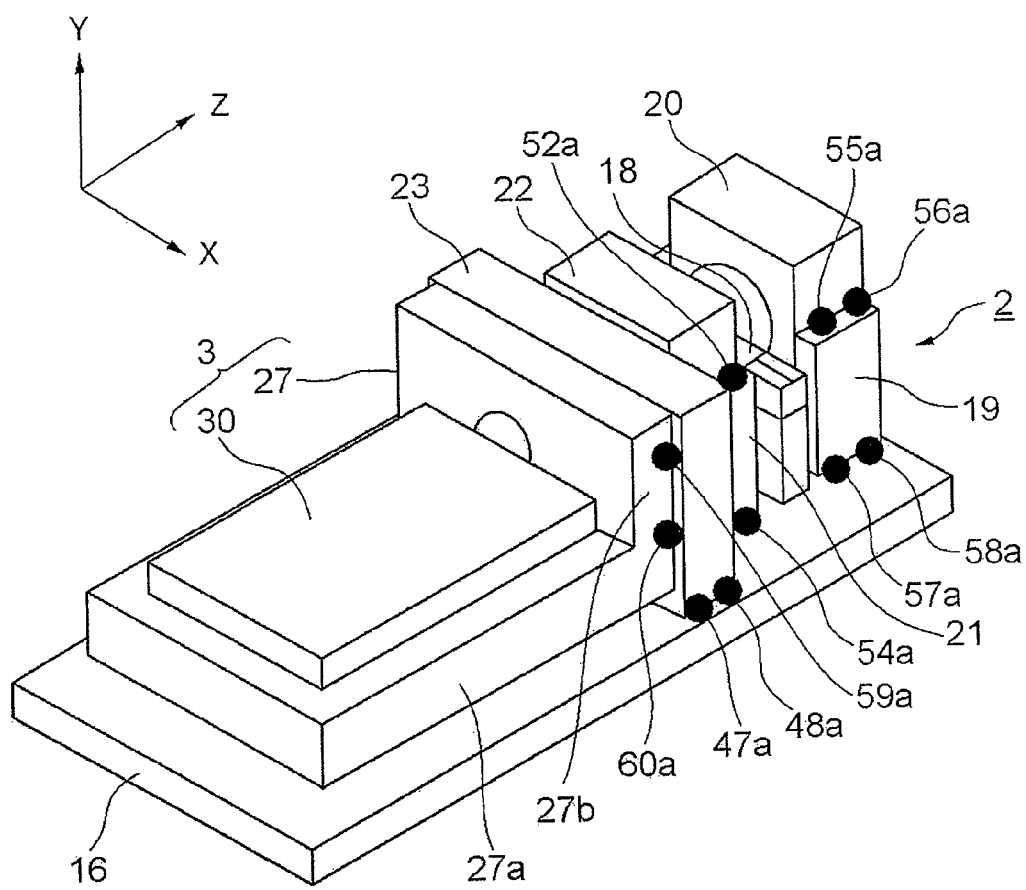
[FIG. 17] A perspective view showing an optical transmission unit according to the fifth example.
Figure 18:
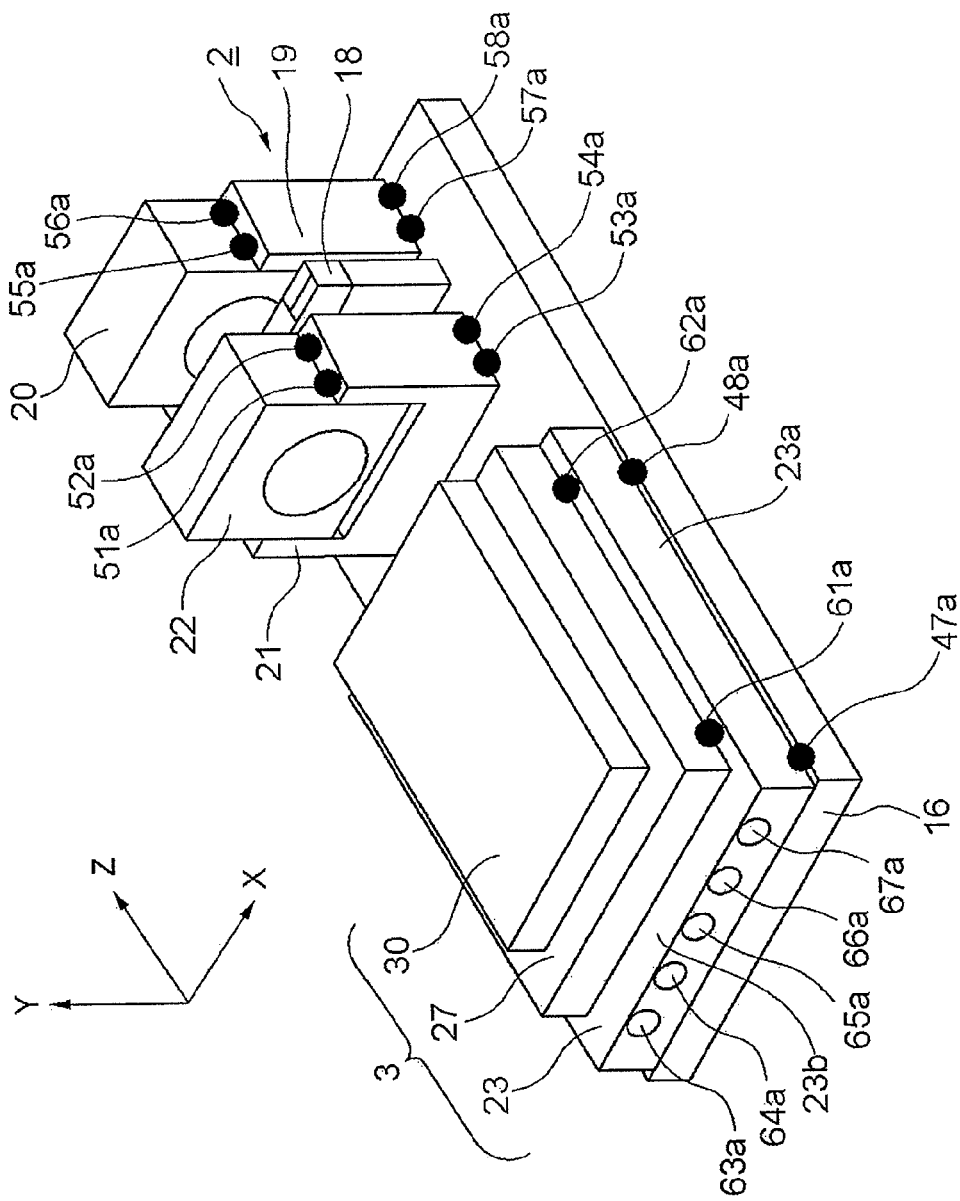
[FIG. 18] A perspective view showing an optical transmission unit according to the sixth example.
Figure 19:
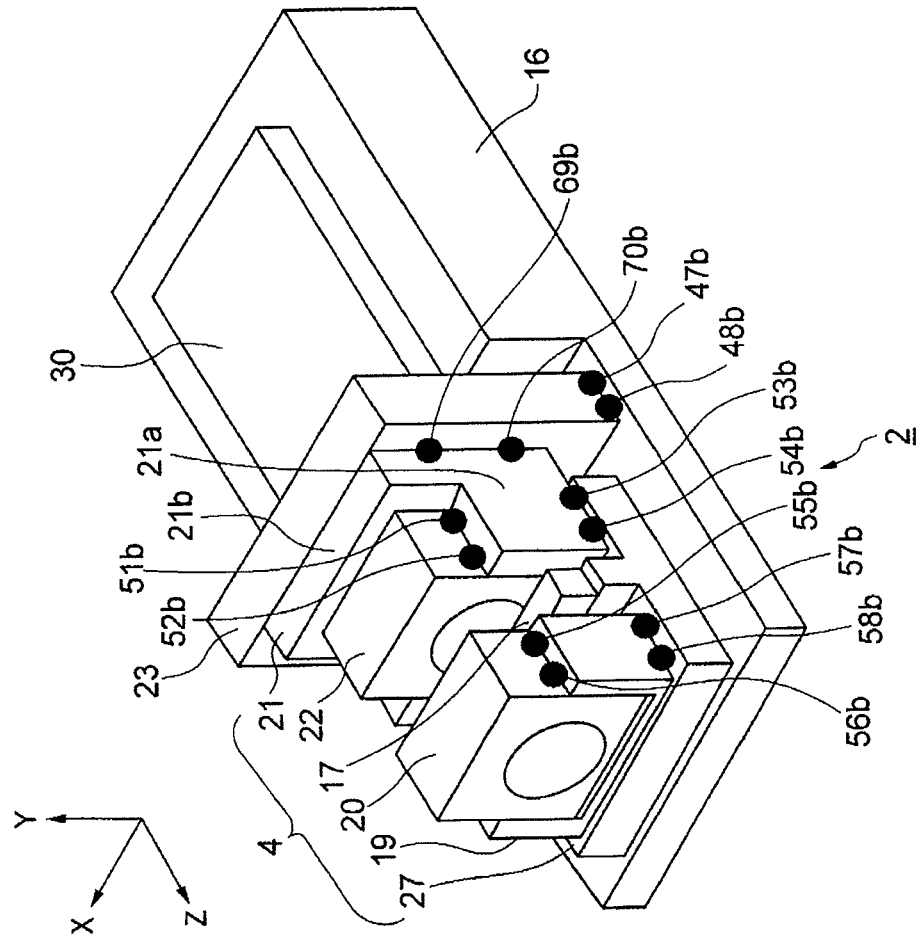
[FIG. 19] A perspective view showing an optical transmission unit according to the seventh example.
Figure 20:
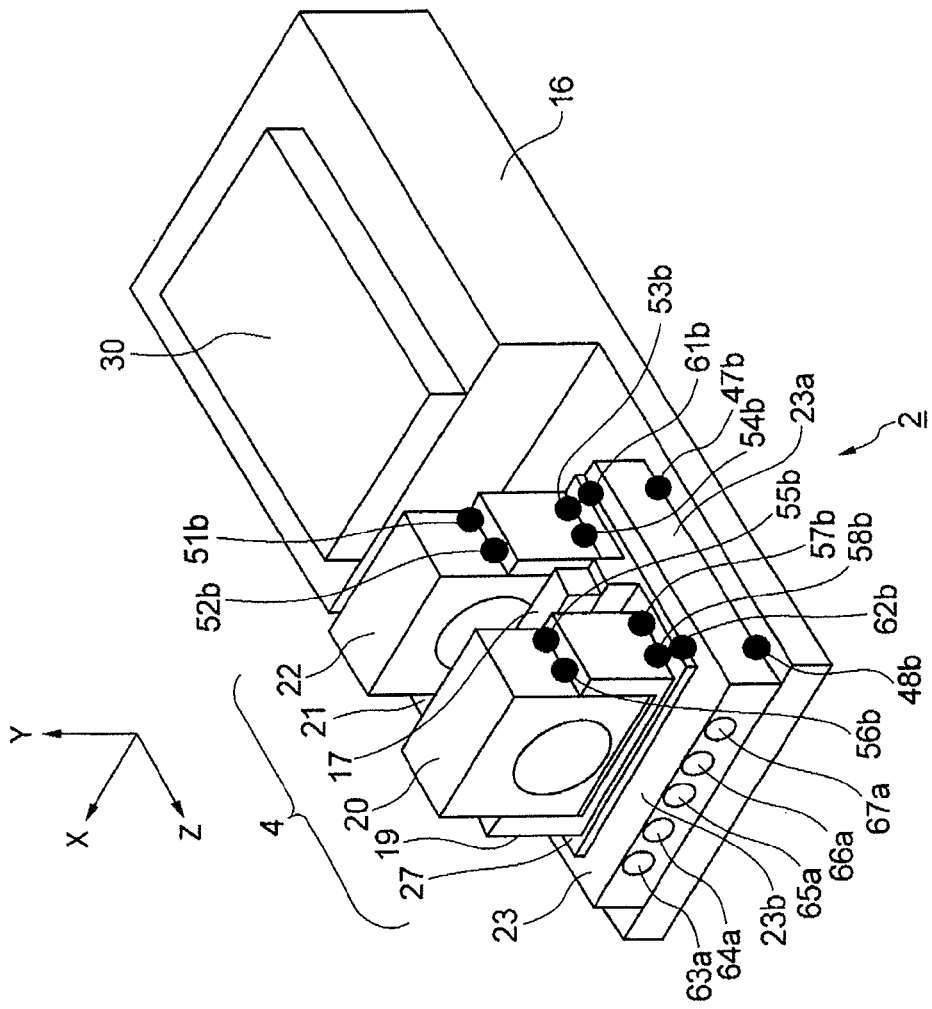
[FIG. 20] A perspective view showing an optical transmission unit according to the eighth example.
Figure 21:
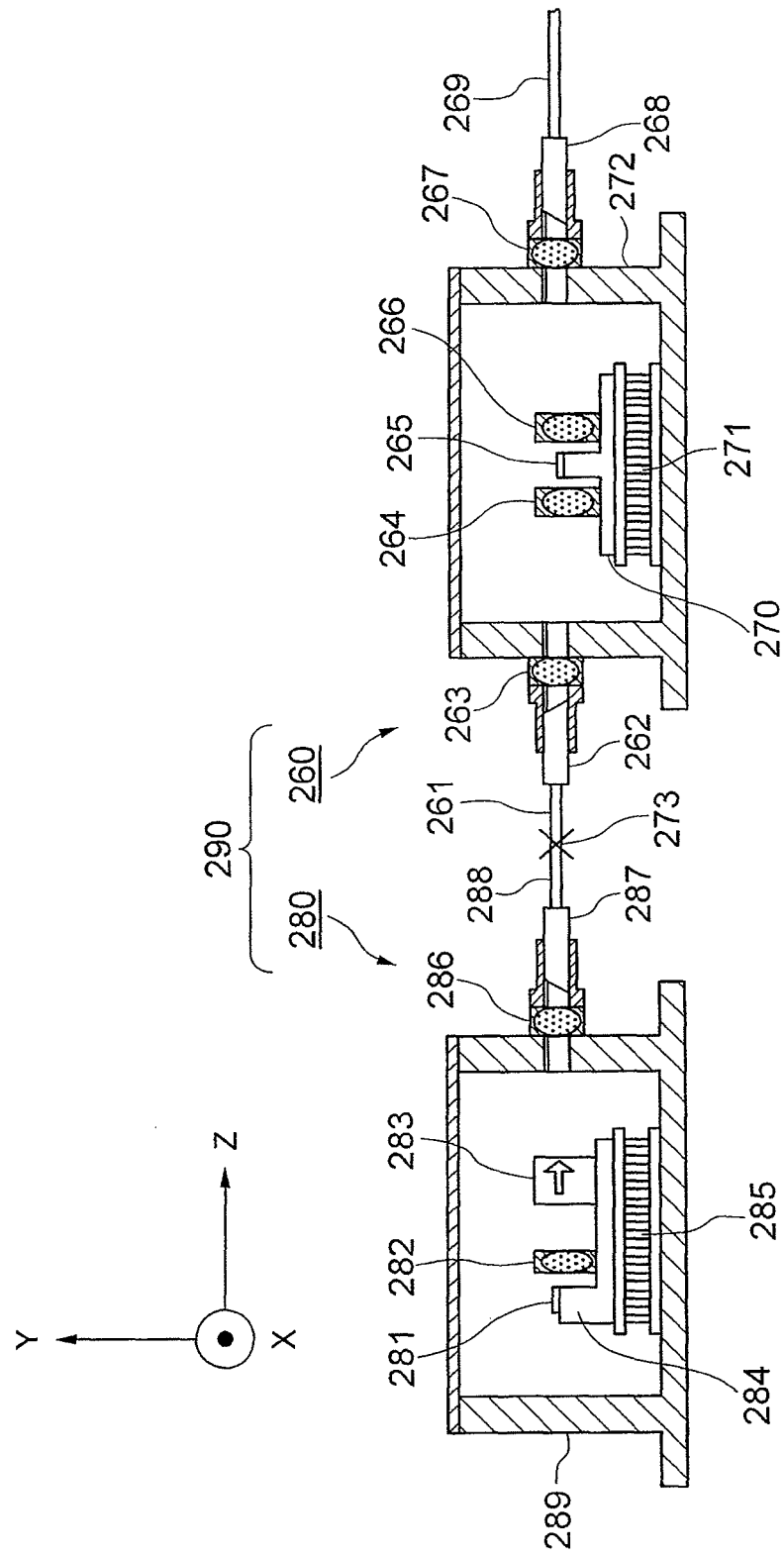
[FIG. 21] A cross-sectional view showing a related example.
Figure 22:
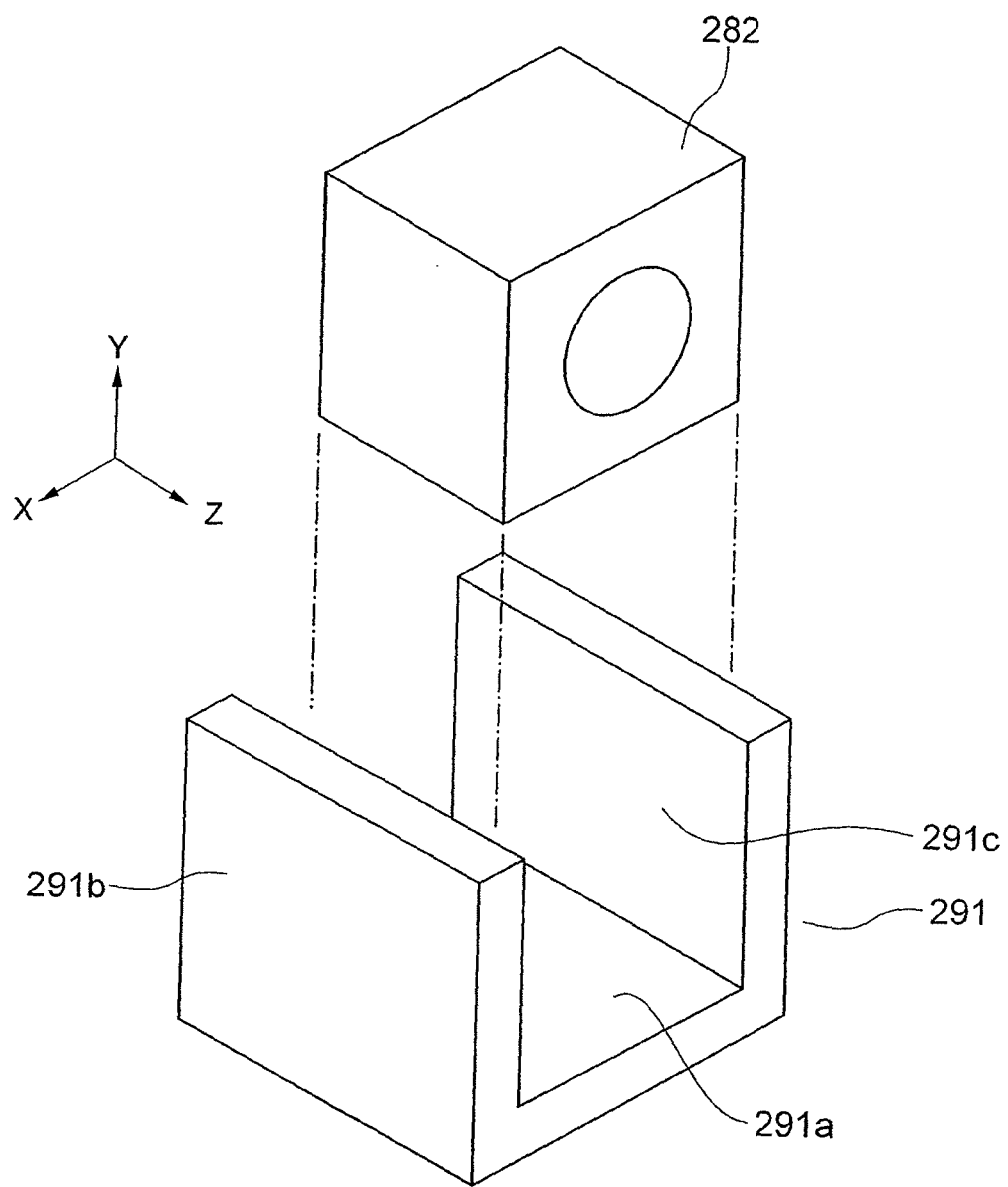
[FIG. 22] A perspective view showing a lens and a lens holder used in the related example.

1 OPTICAL TRANSMISSION MODULE
2 OPTICAL TRANSMISSION UNIT
3 SECOND OPTICAL DEVICE UNIT
4 FIRST OPTICAL DEVICE UNIT
11, 111 PACKAGE
12, 112 PELTIER DEVICE
13, 113 FIBER SUPPORT
14, 114 FERRULE
15, 115 OPTICAL FIBER
16, 116 CARRIER
17, 117 FIRST SUB CARRIER
18 SEMICONDUCTOR OPTICAL AMPLIFYING ELEMENT
118 FIRST OPTICAL DEVICE
19, 119 FIRST LENS HOLDER
20, 120 FIRST LENS
21, 121 SECOND LENS HOLDER
21a LENS HOLDING PART
21b UPRIGHT PART
22, 122 SECOND LENS
23, 123 ELEMENT SUPPORT MEMBER
23a, 123a SMALL CARRIER HOLDING PART
23b, 123b UPSTANDING PART
123c UPRIGHT PART
24, 124 OPTICAL ISOLATOR
25, 125 THIRD LENS HOLDER
25a, 125a LENS HOLDING PART
25b, 125b UPRIGHT PART
25c TAPER PART
25d THIN PART
26, 126 THIRD LENS
27, 127 SMALL CARRIER
27a, 127a ELEMENT MOUNTING PART
27b, 127b UPRIGHT PART
28, 128 SECOND SUB CARRIER
29 SEMICONDUCTOR LASER DEVICE
129 SECOND OPTICAL DEVICE
30 PLANAR LIGHTWAVE CIRCUIT
31 CLIP
32 GRIPPER
33 OPTICAL POWER METER
34 PRESSING TOOL
35 PUSHER
35a PUSHED AREA
41a-62a, 68a, 69a WELDING POINT
63a-67a OPENING FOR WELDIN

The invention claimed is:

1. A manufacturing method for an optical transmission module which includes a first optical device arranged in an output side, a second optical device arranged in alignment with the first optical device with respect to their optical axes, a carrier on which either the first or the second optical device is fixed, an element support member including a first surface parallel to the optical axis and a second surface vertical to the optical axis, a package for housing the first and the second optical devices, the carrier, and the element support member, and a light guide unit for guiding light emitted from the first optical device to outside of the package, wherein the element support member is fixed on the carrier at the first surface thereof, and the other one of the first and the second optical devices is fixed at the second surface thereof, the method comprising:

(1) fixing either the first or the second optical device on the carrier;

(2) adjusting a position of the element support member while the other one of the first and the second optical devices closely contacts with the second surface of the element support member, and fixing the element support member on the carrier; and (3) aligning the first optical device and the second optical device with respect to those optical axes while the other one of the first and the second optical devices closely contacts with the second surface of the element support member, and fixing the other one of the first and the second optical devices on the second surface of the element support member.

2. The manufacturing method for the optical transmission module, as claimed in claim 1, wherein, in the step (2), the element support member is fixed on the carrier by welding at least at each two-point at the same time provided to be symmetric to each other about a surface passing through the optical axis and vertical to a main surface of the carrier 16, and the welding is performed at least at four points in total.

3. The manufacturing method for the optical transmission module, as claimed in claim 1, wherein the element support member is pressed on the carrier during a fixing work in the step (2).

4. The manufacturing method for the optical transmission module, as claimed in claim 1, wherein, in the step (3), welding is performed while the other one of the first and the second optical devices is applied a pressure in the optical direction at a plurality of points thereof centering the optical axis.

5. The manufacturing method for the optical module, as claimed in claim 1, wherein, in the step (3), welding is simultaneously performed at two points point-symmetric with respect to the optical axis, or two points plane-symmetric with respect to a surface passing through the optical axis and vertical to a main surface of the carrier.

* * * * *